(12) United States Patent
Alpert et al.

(10) Patent No.: US 9,312,660 B2
(45) Date of Patent: Apr. 12, 2016

(54) WIRELESS LASER SYSTEM FOR POWER TRANSMISSION UTILIZING A GAIN MEDIUM BETWEEN RETROREFLECTORS

(71) Applicant: WI-CHARGE LTD., Rehovot (IL)

(72) Inventors: Ortal Alpert, Nes Ziona (IL); Rudiger Paschotta, Zurich (CH)

(73) Assignee: WI-CHARGE LTD., Jerusalem (IL)

( * ) Notice: Subject to any disclaimer, the term of this patent is extended or adjusted under 35 U.S.C. 154(b) by 0 days.

(21) Appl. No.: 14/016,151

(22) Filed: Sep. 2, 2013

(65) Prior Publication Data

US 2014/0092929 A1 Apr. 3, 2014

Related U.S. Application Data

(63) Continuation of application No. 12/811,382, filed as application No. PCT/IL2009/000010 on Jan. 4, 2009, now Pat. No. 8,525,097.

(60) Provisional application No. 61/006,255, filed on Jan. 3, 2008.

(51) Int. Cl.
*H01J 3/14* (2006.01)
*G06M 7/00* (2006.01)
(Continued)

(52) U.S. Cl.
CPC . *H01S 5/10* (2013.01); *H01S 3/005* (2013.01); *H01S 3/0604* (2013.01); *H01S 3/083* (2013.01); *H01S 3/0805* (2013.01); *H04B 10/114* (2013.01); *H04B 10/807* (2013.01);
(Continued)

(58) Field of Classification Search
CPC .... H04B 1/02; H04B 1/04; H04B 2001/0408; H04B 2001/0416; H04B 1/06; H04B 1/16; H04B 1/38; H04B 1/40; H01S 3/00; H01S 3/005; H01S 3/02; H01S 3/025; H01S 3/034
USPC ............ 250/216, 221, 214.1; 359/225.1, 515, 359/838, 850; 377/77, 90; 375/316, 295; 398/130, 135, 137, 140, 170, 171; 455/39

See application file for complete search history.

(56) References Cited

U.S. PATENT DOCUMENTS 4,209,689 A * 6/1980 Linford et al. ................ 398/157
4,490,823 A * 12/1984 Komine et al. ................ 372/95

(Continued)

OTHER PUBLICATIONS

Extended European Supplementary Search Report in corresponding European application no. 09700130.9, Nov. 27, 2015.

*Primary Examiner* — Pascal M Bui Pho
(74) *Attorney, Agent, or Firm* — Daniel J. Swirsky; AlphaPatent Associates Ltd.

(57) ABSTRACT

An optical power beam transmission systems, with a directional light transmitter and receiver. The transmitter contains an amplifying laser medium, and this together with a retroreflector in the receiver, forms a laser resonator. When lasing sets in, the receiver can extract optical power through an output coupler and convert it to electrical power. The gain medium may be a disc having a thickness substantially smaller than its lateral dimensions. The laser resonator is operated as a stable resonator to ensure safe operation. This is achieved by use of an adaptive optical element, for reducing the diameter of the energy beam impinging on the gain medium, thereby increasing the overlap between the energy beam and the gain medium. As the transmitter-receiver distance is changed, such as by movement of the receiver, the adaptive optical element focal length changes to ensure that the cavity remains within its stability zone.

1 Claim, 9 Drawing Sheets

(51) Int. Cl.
  H04B 10/00    (2013.01)
  H01S 5/10     (2006.01)
  H01S 3/00     (2006.01)
  H01S 3/083    (2006.01)
  H04B 10/114   (2013.01)
  H04B 10/80    (2013.01)
  H01S 3/08     (2006.01)
  H01S 3/06     (2006.01)
  H04B 1/04     (2006.01)
  H01S 5/04     (2006.01)
  H01S 5/14     (2006.01)
  H01S 3/0941   (2006.01)
  H01S 5/183    (2006.01)
  H01S 3/13     (2006.01)

(52) U.S. Cl.
  CPC ......... *H01S3/08059* (2013.01); *H01S 3/08072* (2013.01); *H01S 3/0941* (2013.01); *H01S 3/1307* (2013.01); *H01S 5/041* (2013.01); *H01S 5/14* (2013.01); *H01S 5/183* (2013.01); *H04B 2001/0416* (2013.01)

(56) References Cited

U.S. PATENT DOCUMENTS

| | | |
|---|---|---|
| 5,132,980 A | 7/1992 | Connors et al. |
| 5,577,060 A | 11/1996 | Nighan, Jr. et al. |
| 7,532,657 B2 * | 5/2009 | Ishizu ............... H01S 3/083 372/100 |
| 8,525,097 B2 * | 9/2013 | Alpert et al. ............ 250/216 |
| 2003/0169784 A1 | 9/2003 | Sutter et al. |

* cited by examiner

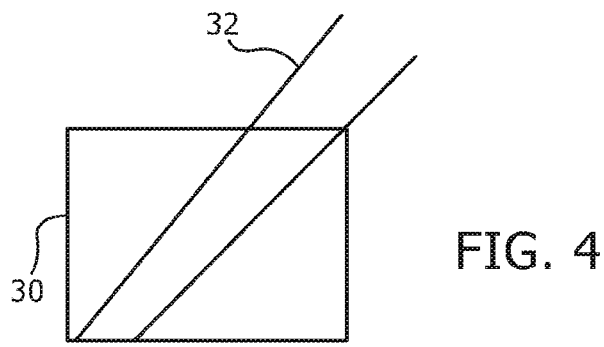
FIG. 4
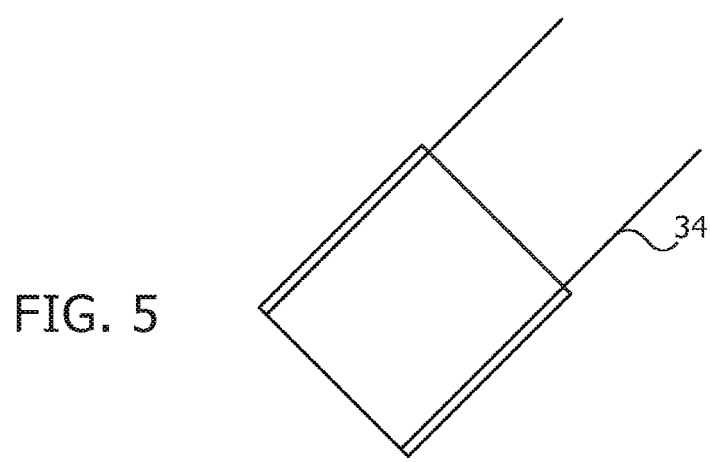
FIG. 5
FIG. 6
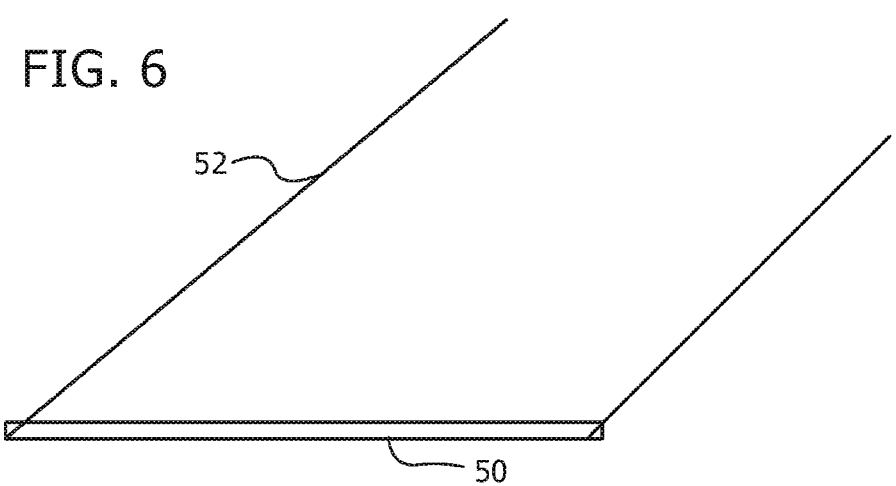

WIRELESS LASER SYSTEM FOR POWER TRANSMISSION UTILIZING A GAIN MEDIUM BETWEEN RETROREFLECTORS

CROSS-REFERENCE TO RELATED APPLICATIONS

This application is a continuation of U.S. patent application Ser. No. 12/811,382, filed Jul. 1, 2010, which is a U.S. National Phase application under 35 U.S.C. 371 of PCT International Application No. PCT/IL2009/000010, which has an international filing date of Jan. 4, 2009, and which claims priority benefit from U.S. Provisional Patent Application No. 61/006,255, filed Jan. 3, 2008, the contents of which are incorporated herein by reference in their entirety.

FIELD OF THE INVENTION

The present invention relates to the field of the wireless transmission of power to a remote device over free space, especially by means of a laser-like system.

BACKGROUND OF THE INVENTION

In recent years mobile devices have found widespread popular use. In many cases, these devices use a battery to provide electric power; in other cases they draw their power from another device such as a computer via an electrical cable, through a USB port for example. One of the most common drawbacks of such devices is the need for recharging the battery, in the case of a rechargeable battery, or replacement of the battery in the case of a non-rechargeable battery, or the inconvenience of requiring a cable connection. It would be desirable if such devices were able to receive their power, or at least part of it, wirelessly from a remote source, thus reducing the need for recharging cycles or change of batteries, while not limiting the device to be bound to a fixed location limited by a cable connection to a power source.

In published International Patent Application No. WO/2007/036937, entitled "Directional Light Transmitter and Receiver", to one of the inventors in the present application, and incorporated herewithin by reference in its entirety, there is described a directional light transmitter and receiver that may be used to transmit power to such a mobile device. A transmitter, fixed for example at the ceiling of a room, contains an amplifying laser medium, and this together with a retroreflector in the receiver, forms a laser resonator. When lasing sets in, the receiver can extract some optical power through an output coupler and convert it to electrical power such as in a photovoltaic cell. The resonator described in WO/2007/036937 may be either a ring cavity or a regular cavity formed between the 6 mirrors of the two retroreflectors.

In order to ensure safe operation of the apparatus described in WO/2007/036937, a system is needed to ensure that the amounts of power that can be emitted outside the confines of the laser resonator in a manner that may pose risk to the neighboring environment, such as to people, animals or equipment, or to components of the system itself, is minimal and complies with the safety limitations in operation to prevent such a danger.

In a system such as the one described in WO/2007/036937, power is emitted to the destination device through the output coupler on the receiver. To ensure safe operation, the system must be designed and constructed in such a way that minimal power is dissipated by the system other than to the power destination. This is especially true for optical power, as it poses a bigger risk to persons and the environment than thermal loss, which is usually locally confined. The system described in WO/2007/036937 relies on the cessation of lasing in the event that an obstruction diverts power from the resonator. However, although such cessation of lasing will generally take place, the need for a high level of safety necessitates more comprehensive safety means to prevent leakage of power in unintended directions. However, the beam may be partially blocked by a transparent object, such as a window, causing a part of the power to be reflected outside the beam's path, but without stopping the lasing. Such a beam may pose a risk to persons or objects in its vicinity, and will also reduce the overall efficiency of transmission, such that there is a need to detect such an occurrence.

In published U.S. patent application number US 2008/0130124 there are described safety methods for preventing unintentional dispersion of a laser beam transmitted from a self-contained laser transmitter to a receiver. In published U.S. patent application number US 2008/0084596, there are described motorized mirror assemblies for use with such a laser beam transmission system. Other systems include a subsidiary beam sent from the receiver to the transmitter to verify that the line of sight between transmitter and receiver is not broken by an intruding object.

Other prior art patents of relevance to the techniques used in this field of interest include U.S. Pat. No. 5,553,088 for "Laser amplifying system" to A. Giesen, and U.S. Pat. No. 5,048,051 for "Optically-stabilized plano-plano optical resonators" to J. J. Zayhowski The disclosures of each of the publications mentioned in this section and in other sections of the specification, are hereby incorporated by reference, each in its entirety.

SUMMARY OF THE INVENTION

The present disclosure describes new optical power beam transmission systems, with a directional light transmitter and receiver. The transmitter contains a retroreflector with an amplifying laser medium, and this together with a retroreflector in the receiver, forms a laser resonator. When lasing sets in, the receiver can extract some optical power through an output coupler and convert it to electrical power, such as in a photovoltaic cell. The resonator may be either a ring cavity or a linear cavity formed between the 6 mirrors of the two retroreflectors. The systems differ from those described in the prior art mainly in the use of an adaptive optical element designed to ensure that the laser operates as a stable resonator, as well as configuring the gain medium so that the transmitter can operate over a large field of view.

The transmitter and receiver should mutually operate safely and with sufficient efficiency that they can provide effective power for mobile electronic devices within their area of reach, regardless of the position and orientation of those devices. The safety and efficiency effects are related, since both are ultimately dependent on the effectiveness with which power dissipation in directions other than in the intended beam, is controlled.

Power can be dissipated from the system in a number of ways other than as intended through the output coupler:
(a) When the resonator is operating outside of its stability zone, as an unstable resonator, the nature of the modes generated are such that power may be dissipated in a way that limits the capability of the system to detect, by measuring power and or beam shape, if such a beam has become partially blocked. Thus, if a person were to position himself inadvertently in the line of sight of the small "spill-over" power of the unstable resonator mode, i.e. that part of the power not reflected back into the resonator, then not only may this spill-over power be unsafe, but its blocking by the person would have no effect on the laser power or the mode shape, and could not thus be detected by monitoring the laser power or mode. This makes it difficult to stop the radiation in time to prevent potential damage to the surroundings. This is illustrated schematically in FIG. 1A which shows such an unstable resonator with a bystander's eye 10 receiving part of the spill-over power 11 from the resonator. On the other hand, when operating as a stable resonator within the stability zone of the resonator, any blocking of the beam, however slight, will instantly cause a significant alteration in the beam's power, or in the beam's mode shape, or in both, making it simple to detect such a blocking. It is therefore important to operate the laser resonator of the system within its stability zone. Furthermore, any bystander 10 outside of the resonator limits will not be subjected to any of the beam's radiation, as shown in FIG. 1B.

(b) The beam may be partially blocked by a transparent object, such as a window, causing some of the power to be diverted outside the beam's path. Mechanisms will be described to detect if such a portion of the beam is emitted in a different direction to that intended.

(c) If the beam intensity at any point exceeds the damage threshold of the components at that point, unpredictable behavior and even failure of this component may happen and power may leak out. This is especially important for the photovoltaic cell, as it handles changing amounts of optical power. The system should be designed to prevent such damage.

(d) The system should ensure that lasing cannot be directed at a reflective object, such as a bathroom mirror, which could behave like a laser resonator mirror. The system must be constructed that lasing is always directed towards a safe receiver capable of handling the directed level of power, and that none of this power is dissipated towards improvised or unintended receivers such as mirrors.

(e) In cases where a significant part of the laser gain volume is not used for lasing towards the receiver, a parasitic laser may be created with an external object. For example, if lasing towards the receiver is done through only 20% of the gain volume, a mirror with a suitable focal length, such as a bathroom mirror, positioned at the correct position and direction, could utilize any of the remaining non-pumped parts of the laser gain medium, and generate lasing between that part and the external mirror. This lasing would create a power leak in the system that may significantly reduce power transmission efficiency, and would probably be unsafe.

The various exemplary systems described in the present disclosure attempt to overcome the above described problems, either by preventing such conditions from arising, or, if unsuccessful in doing so, detecting the condition when it arises and stopping the lasing automatically before harmful amounts of laser radiation are emitted. To ensure these requirements, the following conditions must be fulfilled:

(a) The system must always maintain conditions, especially focal lengths and direction of optical components that force the system to operate within the stability zone of the resonator, i.e. as a stable resonator. These conditions must be automatically maintained by the system while the receiver to transmitter distance and orientation is changing, such as occurs as the receiver moves around the area of coverage of the system.

(b) During operation, the system must be designed in such a way to ensure that lasing would be stopped if an object, transparent, or non-transparent, blocks part, or all of the beam's path. One method to detect such a blocking object is to monitor the beam's power and shape continuously. Another method is to use a detector designed for this purpose. One such detector is described below, an alternative one may be a video camera for monitoring the environment. If such a blocking object is detected, the system must stop lasing before harmful amounts of laser radiation are emitted. Some safety regulations require that there be two independent mechanisms for stopping the lasing if an unsafe situation arises, such as a person intercepting the beam.

(c) The system must be designed in such a way that optical power cannot exceed the damage threshold of any of the components in the system. The photovoltaic cell in particular may experience a wide range of intensities and needs to be protected. A radiation diffusing assembly may be used to achieve this protection.

(d) (i) Since the power density in this system changes between extremes, from a very small focal point to a very large one (especially on the receiver side), more care needs to be taken to address this situation than in a regular cavity laser.

(ii) From an optical point of view, the beam exits the output coupler in an unknown direction, depending on the position of the receiver relative to the transmitter, and with a rather small beam radius. This makes it difficult to use conventional optics in the beam path, as its position is unknown. On the other hand, without additional cooling, which would be inconvenient and an additional expense, photovoltaic cells are today still incapable of handling the power densities generated, which could reach 1 W on a surface area of 1 mm$^2$. Therefore, some sort of beam diffuser must be used to capture the output beam.

(e) During lasing, the system must verify at all time that the receiver receives essentially all of the power, and not just part of it, which may indicate that other parts may be lasing towards unwanted objects. This can be achieved by means of a monitor and control system which follows the power output, and looks for unnatural changes in its level, for instance, whether any decrease in power is typical of a natural decay of the laser power or the detector sensitivity, or is due to an extraneous interruption of lasing.

(f) A startup procedure is essential, which verifies the receiver is equipped to handle the transmitted power is necessary, this procedure would also be used to verify that no extraneous reflective objects such as mirrors cause any lasing.

(g) The system configuration, especially the gain medium, should have a geometry and structure to ensure good beam overlap with the gain medium for a wide field of view, so that no portion of the gain medium volume may contribute to lasing in a different direction. An overlap of at least 50% is desirable.

The resonator is maintained in a condition of stability by the use of an automatic focusing element, which compensates for the change in resonator configuration, and hence in the mode properties, as the resonator increases and decreases in size with motion of the receiver. This can be achieved by using an adaptive optical element, which changes its focal length as a result of a change in an input parameter related to the beam power or mode, either or both of which change with change in resonator length. One exemplary method of implementing this is by the use of a thermal lens, configured to operate as an automatic focusing element. The system relies on the natural expansion of the intra-cavity laser beam as the distance from the beam waist is increased. Thus, any change in distance of the receiver from the transmitter is reflected in a change of the spot size on the thermal lens. This in turn results in a change of the focal length of the thermal lens, and correct design of the thermal lens can enable it to maintain the resonator in a stable configuration in spite of such changes in the transmitter-receiver distance or orientation. Furthermore, should the focal length of the thermal lens become too short to maintain the optimal focal point, additional modes beside the basic $TEM_{00}$ mode may evolve, increasing the $M^2$ parameter of the beam, resulting in an increased spot on the thermal lens. Such an increase in the spot size on the thermal lens in turn results in an increase in the focal length, back towards its optimal length. Such a thermal lens element should be designed to have a thin profile, compared to the expected beam radius, since a thin element is significantly less affected by changes in the direction of the beam, as the decrease in the power density on the element is compensated for by an increase in optical path length.

The "lens" may be in the form of an additive layer to a mirror, i.e., a reflecting element rather than a real lens. Such an automatic mirror can also be electronically or otherwise controlled, (e.g. a deformable mirror or liquid crystal element, controlled by an electronic system) in such case feedback for controlling such a deformable mirror or liquid crystalline element may be taken from the total power transmitted, or from measuring the beam shape or power directly or indirectly, such as by measuring the temperature in different parts of the element. For fixed position receivers, an optical element with a lesser number of degree of freedom may possibly be used.

Stability of the cavity is defined, inter alia, by the focal length of the cavity mirrors. In order to ensure stable operation, the point of convergence of the rays transmitted through the thermal lens must be beyond the active mirror gain material. If a lens or another thermal lens exists close to the gain medium, a suitable correction needs to be applied. However, it is preferable if the beam diameter on the gain medium is not too large compared to the size of the gain medium, as any portion of the beam outside the gain medium will cause a loss of energy and thus decrease the total efficiency of the system.

Furthermore, the amplifying, laser-active part should be constructed in the form of a thin disc, so that its utilization becomes independent of the orientation of the receiver relative to the transmitter. This fulfils the requirement of item (g) above. The term "thin disc" in this context refers to the ratio of the thickness of the gain medium to its lateral dimension or dimensions, and not necessarily to the shape of it. Although a circular disc is most commonly used, the disk may be of other shapes, such as a rectangle or an oval or a triangle. Other terms used in the literature to describe thin gain media, which may be suitable for this application, include, the terms active mirror, semiconductor thin disc, VECSEL and possibly other terms as well, and all are intended to be covered by the generic term "thin disc" used herein.

When turning on the transmitter, assuming a receiver within range and properly oriented, there is initially no focusing power in the form of an active thermal lens, or any other type of adaptive optical element, which could allow for resonator modes of a reasonable radius, so that laser operation cannot start. For start-up, a thermal lens needs to be created. This can be conveniently performed using a controlled electric or optical heater built into, or in close proximity to, the thermal lens mirror. Such a lens can also be initiated by placing a liquid crystal element or a deformable mirror in proximity to the thermal lens. The start-up procedure can be as follows:

(i) Increase the heater power until lasing starts, i.e., until power generation on the photovoltaic cell is detected. If lasing is not achieved even with the highest heater power, the controller may try again after a certain time intervals or with a different heating profile, such as more centered heating, and if unsuccessful then, may possibly "give up" after a while. The combined power of heater and laser beam may be too high for keeping the resonator stable. The laser power will then probably fluctuate with a relatively small mean value.

(ii) Then ramp down the heater power slowly. The laser power should then gradually increase, more and more taking over the task to keep the thermal lens at its desired optical power.

If lasing stops for any reason, the device may try at regular intervals to reestablish operation by repeating the start-up procedure.

There is thus provided in accordance with an exemplary implementation of the presently claimed invention, a freespace lasing system for generating a laser beam, the system comprising:

(i) a power transmitting unit comprising a first retroreflector, and having an angular field of view, (ii) at least one power receiver unit comprising a second retroreflector, and remotely located relative to the power transmitting unit, (iii) a gain medium disposed between the first and second retroreflectors, in proximity to the first retroreflector of the power transmitting unit, and (iv) an element for extracting energy from the beam, wherein the gain medium has a geometric form such that the lasing is maintained even when the beam is aligned over essentially the entire field of view.

In such a system, the field of view may be any of at least ±5 degrees, at least ±15 degrees or at least ±30 degrees. The gain medium may have a thickness between the surfaces between which the beam traverses substantially smaller than its lateral dimensions, and it may also have an anti-reflection coating on at least one of its surfaces, adapted to reduce reflection from the at least one surface, such that the lasing is maintained even when the beam is aligned over essentially the entire field of view. The thickness of the gain medium may further be substantially smaller than its lateral dimension, such that the gain profile of the gain medium is substantially independent of the beam alignment over essentially the entire field of view.

Such a system may further include at least one adaptive optical element for modifying the properties of the lasing system such that stable resonator modes are obtained. The at least one adaptive optical element may be such as to reduce the diameter of the laser beam impinging on the gain medium, thereby increasing the overlap between the laser beam and the gain medium. In any of the above systems, at least one of the adaptive optical element and the gain medium should have sufficiently low birefringence that the generation of spurious birefracted beams is significantly reduced.

Additionally, the adaptive optical element may comprise either a thermal lens, or a lens or a mirror, mechanically deformable according to an applied control signal, or a pixelated liquid crystal array disposed such that the phase shift of light passing through a region of the element can be changed in accordance with a control signal applied to at least one pixel adjacent the region. In the case of the latter two implementations, the applied control signal may be related to a characteristic of the laser beam of the lasing system.

In the case of a thermal lens, it may be generated by a partially absorbing layer on the surface of the adaptive optical element. Furthermore, the thermal lens may be made of a material which is partially absorbing in order to absorb enough energy to generate the thermal lens. Yet other exemplary implementations may involve a thermal lens comprising a material having a value of $dn/dT/\kappa$ such as to reduce the optical power required to create the focusing power of the thermal lens, where $dn/dT$ is the temperature differential of the refractive index of the material, and $\kappa$ is the thermal conductivity of the material. In such a case, the material may advantageously have a value of dn/dT/K of at least 0.00001 m.$^{-1}$Kg$^{-1}$sec$^3$. Furthermore, the thermal lens may comprise a heating element for generating the thermal profile required to create it.

Furthermore, in the above-described systems, the optical form of the adaptive optical element may determined by feedback from a characteristic of the beam. In this case, the characteristic may be derived from the level of the output power of the laser beam.

Additionally, in such a free-space lasing system with an adaptive optical element, the overlap may be maximized by adjusting the focusing power of the adaptive optical element, such that the laser beam does not experience significant additional angular shift as a result of the focusing power adjustment. Such an adaptive optical element may be located adjacent to either the first or the second retroreflector.

In any of the above-described systems, the gain medium may be adapted to emit a laser beam essentially parallel to a laser beam incident upon it. Additionally, the optical thickness profile across the width of the gain medium when the laser beam is traversing it may be such that the laser beam emerges from the gain medium in a direction essentially parallel to the direction in which the laser beam impinges on the gain medium. In the latter case, the optical thickness profile across the width of the gain medium may be controlled by means of a temperature profile generated across the width. Also, the system may further comprise an additional optical element adapted to compensate for the change in the optical thickness profile of the gain medium arising from the lasing.

Other exemplary implementations can involve a free-space lasing system as described above, further comprising an optical diffusing element adjacent to the element for extracting energy, such that the extracted energy is spatially dispersed before impingement on a photoelectric device used for converting the extracted energy.

Further implementations involve a system wherein the lateral dimension of the gain medium is selected such that the Rayleigh length of the laser beam is at least a significant fraction of the distance between the transmitting unit and the receiver unit. The significant fraction could be at least 2%, and the lateral dimension of the gain medium may be sufficiently small that the power threshold for lasing is no more than an order of magnitude larger than the power of the transmitted beam.

Other implementations may further involve a free space lasing system as described above, wherein the gain medium optical thickness for different polarizations of the laser beam is substantially small compared to the diameter of the gain medium, so that transmitted beams of different polarizations substantially overlap. The gain medium may be made of a material having low birefringence. Additionally, the gain medium optical thickness for different polarizations may be such that the transmitted beams overlap is greater then 50%

Any of the above described systems may further comprise an optical detector disposed such that it detects objects within the beam path. The optical detector should be capable of detecting opaque and transparent objects, and such objects are detected optically by monitoring for changes in any one of the beam power and the transmission of a probe beam of light between the transmitting unit and the receiver unit. Alternatively, the objects are detected by monitoring the transmission of the probe beam, where a signal is transmitted from the transmitter and is reflected back to the transmitter by the receiver, or vice versa. In any of such implementations, the objects may be detected by transmission of light of a probe beam having at least one wavelength selected to be absorbed by common transparent materials such as glasses and plastics. The wavelength may be in either the UV or IR regions.

Another example implementation can involve a wireless power receiver for receiving a beam of optical power, the receiver comprising:
(i) a retro reflector for reflecting a major part of the beam,
(ii) an adaptive optical element inserted in the path of the beam, adapted to focus the beam, and
(iii) a light coupler capable of extracting optical power from the beam,
wherein the receiver is adapted to receive power wirelessly from a remote transmitter unit. In such a receiver, the adaptive optical element may be adapted to image the retroreflected beam at a plane at least as far as the remote transmitter unit. In either of these cases, the remote transmitter unit should comprise a second retroreflector, such that the transmitter and the receiver units constitute a resonator, and the adaptive optical element is adapted to maintain the resonator within its stability limit.

The adaptive optical element may includes a thermal lens, or a lens mechanically deformable according to an applied control signal, or a pixelated liquid crystal array disposed such that the phase shift of light passing through a region of the element can be changed in accordance with a control signal applied to at least one pixel adjacent the region.

In such receivers, the adaptive optical element may have a sufficiently large lateral dimension that the retroreflected beam does not extend beyond the lateral dimension for a wide range of angles of incidence of the beam.

The remote transmitter unit may further comprise a gain medium, the gain medium having a lateral dimension such that the Rayleigh length of the beam of optical power is at least a significant fraction of the distance between the transmitter unit and the receiver. That significant fraction may be at least 2%. Furthermore, the lateral dimension of the gain medium may be sufficiently small that the power threshold for lasing is no more than essentially an order of magnitude larger than the beam power.

Any of these exemplary receivers may further comprise an energy converter for converting part of the beam into electrical power. Additionally, they may include a wireless data transceiver, capable of transmitting and receiving signals to and from the transmitter unit. Such signals may indicate safe operation of at least one of the receiver and the transmitter unit. The transceiver may also be capable of receiving a signal instruction for initiating the adaptive optical element. In the latter case, the receiver should further comprise a power source capable of supplying power to initiate the adaptive optical element.

Yet other implementations describe a method of operating a free space laser, the laser comprising:
(i) first retroreflector having a gain medium juxtaposed thereto,
(ii) a remotely located second retroreflector,
(iii) an adaptive optical element juxtaposed to either of the first and the second retroreflectors, and
(iv) an element for extracting energy from a laser beam reflected between the retro reflectors,
the method comprising the sequential steps of applying an input impulse to the adaptive optical element to provide it with an initial focusing power, and exciting the gain medium to induce lasing.

This method may further comprise the step of removing the input impulse to the adaptive optical element when the lasing has commenced. Furthermore, the first retroreflector having a gain medium juxtaposed thereto may comprise a transmitter, and the remotely located second retroreflector and the element for extracting energy from the laser beam may comprise a receiver, and the method may then further comprise the step of transmitting a signal between the transmitter and the receiver in either direction, the signal providing information indicating parameters relating to the laser. The information may include at least one of beam power, wavelength, pulse duration and availability for operation. Additionally, the information may include identification of at least one of the transmitter and the receiver. The signal may be used to indicate that safe operation is achieved. In such a case, the method may further comprise the steps of stopping lasing when the signal indicates that lasing is unsafe, or in the absence of a signal indicating safe operation. Additionally, the method may comprise the step of providing external detectors indicating safe operation of the laser.

Another exemplary implementation involves, a free space laser, comprising:
(i) a first retroreflector having a gain medium,
(ii) a remotely located second retroreflector having juxtaposed thereto, an element for extracting energy from a laser beam reflected between the retro reflectors, and
(iii) an adaptive optical element juxtaposed to either of the first and the second retroreflectors,
wherein the adaptive optical element is dynamically configured to modify the resonator properties of the laser such that stable resonator modes are obtained.

In such a free space laser, the adaptive optical element may be dynamically configured in accordance with changes in a characteristic of the laser beam. The gain medium may have a thickness between the surfaces between which the beam traverses, substantially smaller than its lateral dimensions. Additionally, the gain medium may be such that its gain is substantially unchanged when the angle of incidence of the beam is varied over a range of at least ±30°.

It is to be understood that throughout this application, and as may be claimed, the terms optical power, focusing power and dioptric power are understood to be synonymous, indicating the optical focusing power of the element under consideration.

Furthermore, it is to be understood that the terms cavity and resonator, as used throughout this application and as may be claimed, are understood to be synonymous, notwithstanding the possible implication that a cavity is often used in other literature to relate to a closed structure, unlike the open nature of the resonators of the present systems.

Additionally, the gain of the gain medium is understood to mean the magnitude of the gain of the gain medium.

BRIEF DESCRIPTION OF THE DRAWINGS

The present invention will be understood and appreciated more fully from the following detailed description, taken in conjunction with the drawings in which:

FIG. 1A shows schematically an unstable resonator with a bystander's eye receiving part of the spill-over power from the cavity; while

FIGS. 4 to 6 illustrate the criteria used which result in the choice of the thin disc for the lasing material: FIG. 4 shows an example of a thick piece of lasing material, having poor overlap with the lasing beam; FIG. 5 shows the situation of FIG. 4 where the lasing material is turned such that its crosssection faces the laser beam; FIG. 6 illustrates a solution enabled by use of a thin disc of lasing material, which always has good overlap with the beam;

DETAILED DESCRIPTION OF THE INVENTION

Figure 1A:
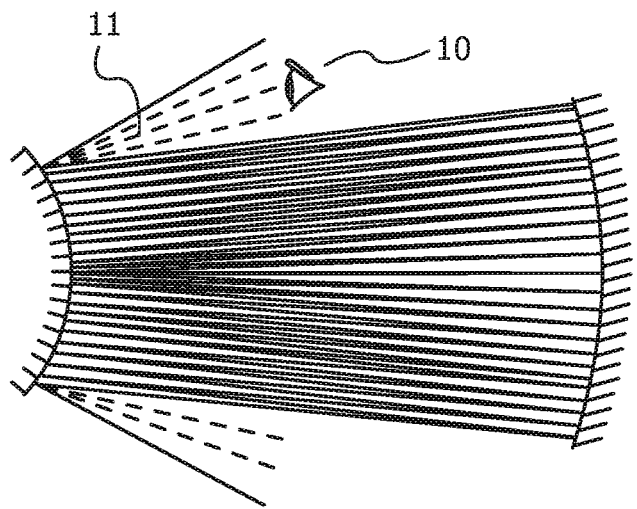
Figure 1B:
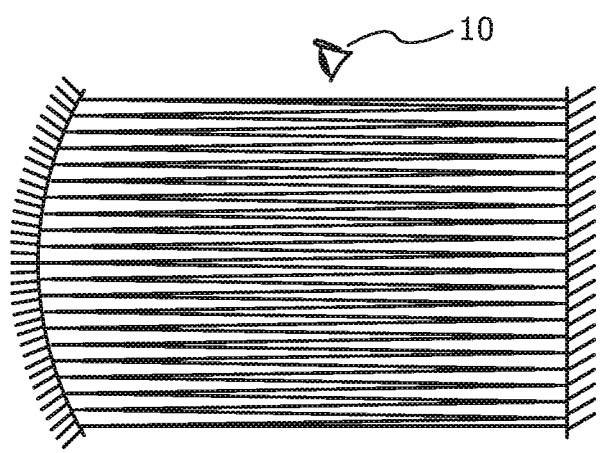
FIG. 1B shows how a bystander outside of the cavity limits of a stable resonator will not be subjected to any of the beam.
Figure 2:
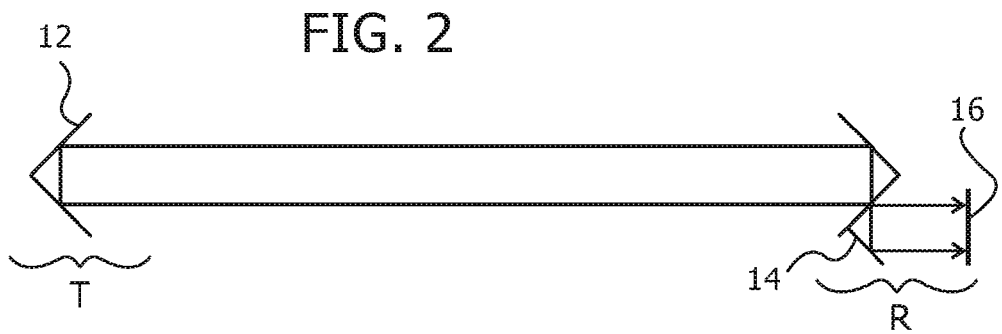
FIG. 2 illustrates schematically an exemplary power transmitting system described in the present disclosure.

Reference is now made to FIG. 2, which illustrates schematically an exemplary power transmitting system comprising an electrically powered transmitter T, and a receiver R, which allows extraction of electric energy, in order to power, for instance, a mobile electronic device. The transmitter should be mounted at a safe location out of reach of possible human contact, such as on the ceiling of a room or connected to a lighting fitting. The position should be such that the transmitter has a line of sight to as much of the room's volume as possible. Suitable positions may be to embed the transmitter within a ceiling lamp, within a television set or within a speaker unit, one approach to achieve that would be to add a standard lamp connection to the transmitter so that it can connect to a standard lamp fitting.

T and R form a laser resonator, in which significant power circulates in the form of a laser beam(s), which may advantageously be in the infra-red. Since this arrangement of mirrors constitutes a ring resonator, two counter propagating beams may exist, and, with some arrangements of the mirrors, up to 6 beams. The transmitter contains the laser gain medium, which may be pumped, for instance, with a laser diode, while the receiver extracts a small part of the circulating laser light to a photovoltaic cell, or to another energy converting unit, which can then generate electricity for powering the mobile device. Certain measures have to be taken to allow lasing operation over a wide range of positions and angular orientations of the receiver R for a given position of the transmitter, T. These measures are generally directed at providing a maximum field of view for the transmitter, where the field of view is understood to be the angular extent of the directions to which the transmitter can transmit to a receiver at any given time.

Firstly corner cube reflectors may be used in both T and R. This allows the establishment of a beam path in the form of a non-planar ring, with three reflections each at both T and R. The beams between T and R are approximately parallel. As the system usually exhibits bidirectional laser oscillation, i.e., oscillation in both propagation directions, two output beams may generally occur at the output coupler, though from one to six beams is also feasible. Both the transmitter and the receiver may contain retroreflectors, essentially as described in the above referenced WO/2007/036937. The retroreflectors of both T and R actually contain three rather than two mirrors, but only two mirrors are shown in the two-dimensional drawing of FIG. 2. One of the mirrors in the retroreflector R should be an output coupler 14, partially transmitting the light to a photovoltaic cell 16, or other conversion device, from which electric power may be taken to power the mobile device associated with the receiver.

Figure 3:
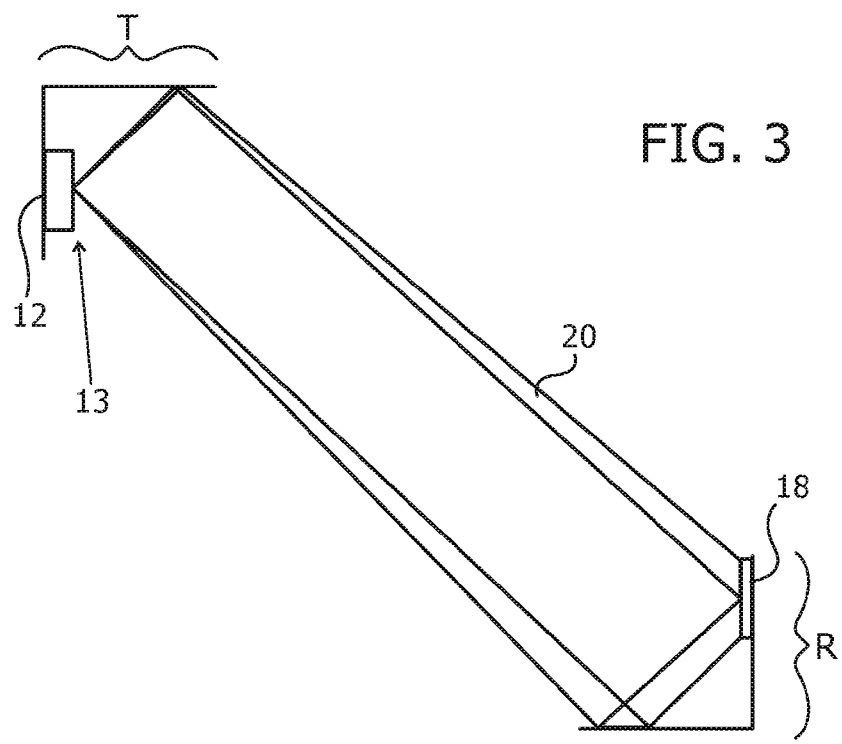
FIG. 3 is a more pictorial view of the system of FIG. 2.

FIG. 3 is a more pictorial view of the system of FIG. 2, showing a schematic form of the ring lasing beam 20, with the transmitter T on the top left hand side, containing an active mirror 12 with a gain medium 13, and the receiver R on the bottom right hand side. An adaptive optical element 18, whose function will be expounded hereinbelow, is shown attached to one of the reflection surfaces of the receiver retroreflector. The adaptive element may also be incorporated into the transmitter, or there may even be such elements in both receiver and transmitter. Although the receiver location has the advantage that several receivers could possibly be used with a single transmitter, it also has the disadvantage of putting possibly power-consuming elements into the receiver, where energy is more sparse than in the transmitter, and the space requirements may be tighter.

Figure 3A:
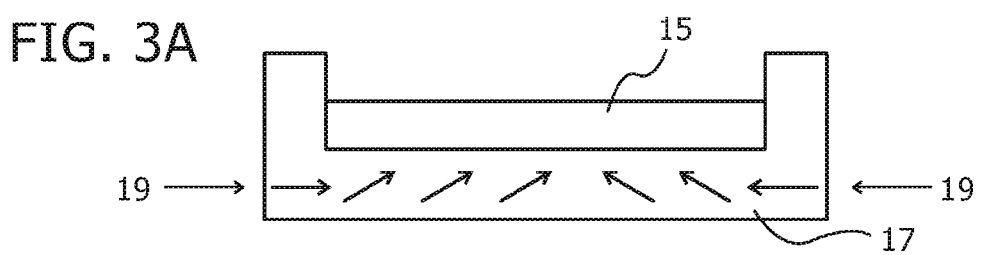
FIG. 3A shows schematically a thin disc of lasing material mounted on a light conveying substrate, pumped from its edges, such as could be advantageously used in the system of FIG. 3.

The gain medium of the exemplary system of the present disclosure may be integrated into the transmitter in the form of an active mirror 12, which is the nomenclature used herewithin for a reflector having a thin disc of gain medium, such as in a thin disc laser. Such a geometry has a number of advantages over prior art systems, as will be described hereinbelow. The active mirror 12 may form one of the three reflectors of the corner cube retroreflector used in the transmitter. It may be pumped with a laser diode, with the pump beam hitting the active spot at some convenient angle. A pump configuration which obstructs as little as possible of the beam aperture is most advantageous in this application, because of the need for a large angle of coverage from the transmitter exit aperture. An advantageous configuration incorporates a thin disc of lasing material 15 mounted on a light conveying substrate 17, pumped from its edges 19, as is known in the art, and as shown in FIG. 3A, such that the light enters the lasing material over essentially the whole of its surface area, yet without the pump source blocking any part of the beam aperture over the surface of the disc.

Reference is now made to FIGS. 4 to 6, which illustrate the criteria used which result in the choice of the thin disc for the lasing material. The problem to be solved is that of the variable direction from which the beam may impinge on the lasing material as the receiver is moved relative to the transmitter. The system described in this disclosure is intended to enable a moving receiver to always be in such optical laser association with the transmitter, that the lasing takes place regardless of the position and angle of the receiving element. To maintain the efficiency of the system, good overlap is required between the beam and the active part of the lasing material. FIG. 4 shows an example of a thick piece of lasing material 30, having poor overlap with the lasing beam 32 impinging on the lasing material at an arbitrary angle. In FIG. 5, there is shown the situation where the lasing material is turned such that its cross-section faces the laser beam 34, thus providing good overlap and good lasing efficiency. However such a method would require a servo mechanism to rotate the lasing material so that it always faces the correct direction in space towards the receiver as the receiver moves around. Such a mechanism is costly and complex, and may be prone to failure.

Reference is now made to FIG. 6 which illustrates a solution enabled by use of a thin disc of lasing material 50. There is always good overlap of the beam with the thin disc of lasing material 50, regardless of the position of the receiver, and hence of the direction of the beam 52 connecting transmitter with receiver. The good beam overlap over a wide field of view is also advantageous in that it ensures that most of the lasing medium volume is involved with generating the main beam being transmitted, such that little or none of it may contribute to lasing in a different direction. The thin disc of lasing material does not necessarily have to be disc shaped, i.e. round, but can be any shape, having its thickness between the surfaces of impingement of the laser beam substantially less than its lateral dimension. Such a thin disc of gain material is also known as an active mirror. A VECSEL (Vertical External Cavity Surface Emitting Laser) diode, also known as a semiconductor thin disc, can also be used to provide such an advantageous overlap.

Figure 7:
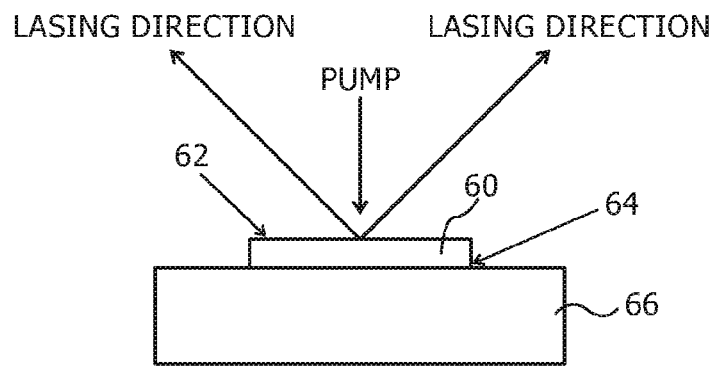
FIG. 7 is a schematic view of an exemplary implementation of the active mirror transmitter head for use as one of the three reflectors of the corner cube in the transmitter of a system of the present disclosure.

Reference is now made in FIG. 7 which is a schematic view of an exemplary implementation of the active mirror (thin disc) transmitter head for use as one of the three reflectors of the corner cube in the transmitter. The laser crystal may be of Nd:YAG in the form of a thin disc 60, having an anti-reflection coating 62 on its outer face and a reflecting dielectric or metallic coating 64 on the back side, which may be directly mounted on a heat sink 66, which can be air cooled, water-cooled or Peltier cooled. An exemplary 150 µm thick disk of this material with a Nd doping concentration of 2% enables efficient absorption of a pump beam at 808 nm in a double pass of the pump radiation, assuming that the above-mentioned reflective coating 64 reflects at a reasonable level, both laser and pump light. If the pumped area has a radius of approximately 0.6 mm, a pump power of 15 W can generate more than 50% optical gain, which should be sufficient for an application for beaming power to a mobile electronic device, such as a phone or a laptop.

The use of Nd:YAG, rather than the cheaper Nd:Glass (though the recent availability of Nd:YAG in ceramic form may significantly reduce the cost differential) is advantageous, since:
(i) It has a high gain efficiency and thus allows working with a relatively large pumped spot, limiting the beam divergence and thus the beam size at the receiver.
(ii) It offers high pump absorption without using complicated multipass optics.

A disadvantage of materials like Nd:YVO$_4$ is that its gain is strongly polarization dependent, so that polarization considerations have to be taken into account also. Furthermore, since Nd:YVO$_4$ is birefringent, it is potentially unsafe to use in these systems, since the birefringence of the gain medium may split the beam into 2 or 4 beams. One of these beams will be reflected back along the lasing cavity, while the other beam or beams will be emitted parallel the main beam but shifted or even at a different angle in some rare cases. These other beams may pose a safety risk, as they may hit a person or object. It is therefore safer to use a gain medium with low birefringence such as Nd:YAG instead of Nd:YVO$_4$. or a medium with low optical thickness so that beams of different polarizations (or the two components of the same beam), will not undergo a large shift and emerging beams will substantially overlap. Furthermore, mechanical stress, which may be induced by inhomogeneous heating, can introduce stress birefringence even in a material not having a natural birefringence. Therefore, even if a medium without natural birefringence is used, it should, as far as possible, be operated under conditions with minimal induced stress. Additionally, birefringent materials should be avoided for use in the thermal lens and in the front windows of the transmitter and the receiver, unless low optical thickness components are used.

An important aspect of the active mirror approach in the systems of the present application is that a semiconductor gain chip (VECSEL) could be used in the above-described systems instead of a laser crystal. Optically or electrically pumped semiconductor lasers without a reflective coating on at least one surface (VECSEL's), as mentioned above, have the potential of cheap mass fabrication and allow for relatively high output powers with small beam distortions. The typical size of such VECSEL's even allows the assembly of two or more such VECSEL's at normal angle to each other, to have two amplifying mirrors instead of one. Such a structure has the following advantages:

(i) It is small and allows for high gain.
(ii) It can be mass produced.
(iii) The proximity of the gain chips allows for optical pumping with one or more pump beams.
(iv) The proximity of the gain chips allows for a single cooling system to be used on all gain chips. To achieve that, the size of the pumped area on the gain chips must be slightly higher, and not all of it will be used.

As previously stated, in order to achieve safe laser operation, it is necessary to operate the cavity in a stable, rather than an unstable configuration. One of the features which characterizes a stable resonator is that the mode diameter at the gain volume must be smaller or equal to the gain media effective cross section diameter. If it is bigger, part of the amplitude distribution will be cut off and the mode will propagate as an unstable resonator mode. Typically the gain volume is not bigger than a few millimeters in diameter, therefore the system should have a focal point on, or slightly behind the surface of the gain medium, but not in front of it. It is to be understood that the term "focal point" is not used herewithin to mean the point at which the beam is actually focused, which is changeable and depends on the form of the mode at any particular time, but rather in the sense of the center of curvature of the beam's wavefront after it has passed throughout the optical elements, which in this case is the center of curvature of the receiver mirror, (which is approximately half the focal length of the mirror, in the case where a mirror is used) or the optically equivalent point in the case when a lens is used. This "focal point" is thus a geometric property of the cavity configuration used. In cases where there are more optical components in the system, or even thermal lenses operative at the gain medium, the "best" position of the focal point may change, but the beam's diameter in the gain medium must be smaller than or equal to the effective cross section diameter of the gain medium. The resonator should operate close to the edge of its stability region, with the beam having a small radius on the active spot of the gain medium and reaching a significantly larger radius on the rear mirror at the receiver.

In order to maintain such a focal point position, when the receiver may be moving relative to the transmitter, the focal distance of the cavity mirror has to be changed constantly as the receiver is moved.

One method of achieving such a variable focus would be by use of a variable focus optical system. A control system could be used to bring the focal point close to the active mirror by mechanically, electronically or optically changing the properties of the optical system. One example of such a system would be a zoom lens with a servo control mechanism activated for instance, by the power level of the lasing. Such systems, although feasible, have a number of disadvantages, especially that they are complicated and therefore may be expensive and prone to failure. Furthermore, precise positioning in both the longitudinal and transverse directions is required at the same time to obtain lasing. Even with adjustment of the zoom lens position in all directions, the range of accessible directions would probably be substantially limited.

It would therefore be preferable if a self aligning optical system could be used, without a mechanically servo-controlled focusing element. Such a system should be capable of performing the following functions:
(i) automatically adjusting the lens position to the center of the beam;
(ii) automatically maintaining the exact focal distance required to achieve lasing; and
(iii) allowing the system to turn a single receiver on while turning all the other receivers in the vicinity off, such that the system would lase only towards the receiver turned on. At a later point in time the system may turn another receiver on, while turning the first receiver off to allow that second receiver to receive power. It is assumed that receivers may be equipped with an energy storage device such as a capacitor or a battery, enabling it to supply power continuously while optical power is not available. It is preferable that only one receiver is turned on at any point in time.

An adaptive optical element would be a suitable component for performing such a function. A number of potentially useful types of adaptive optical elements are available. Amongst such elements are thermal lenses, lenses which can be mechanically deformed by means of piezoelectric or similar actuators, and optical elements incorporating pixelated liquid crystal cells, which can be switched to provide small phase shifts necessary to change the optical power form of the element. Elements, such as mechanically deformable lenses and those incorporating liquid crystal cells are dependent on obtaining a feedback input from one of the system outputs, such as the optical power. Thus, for instance, a deformable mirror whose shape is adjusted to bring the focal point to the correct position, could use the laser power as the input parameter to control the deformable mirror, by means of changes in the thermal expansion of different parts of the lens. Thermal lenses on the other hand can be made to be self adjusting once lasing has commenced, relying for their operation only on the laser power incident on them, and without any other control input. In the description following, a thermal lens is used as an exemplary implementation of the use of an adaptive optical element in the present systems, though it is to be understood that such a thermal lens is not meant to limit the invention, but is merely used as an example for any type of adaptive optical element.

Thermal lenses are known in the art, such as in U.S. Pat. No. 5,386,427 for "Thermally controlled lenses for lasers" to John J. Zayhowski, and U.S. Pat. No. 4,872,743 for "Varifocal optical element" to T. Baba et al. The thermal lens effect arises when the material of the optical element under consideration has a thermo-optic effect, quantified by variation of the refractive index n, with temperature T, dn/dT, such that when, for instance, the gain medium is hotter on the beam axis than at the outer regions, a transverse gradient of the refractive index is generated, creating a lens effect. Also, thermal lensing effects can arise from thermally induced stress via piezo-optic and/or surface bulging effects.

A correctly designed thermal lens could have the following properties, which would enable it to fulfill many of the above requirements.

(i) For most beams shapes, and in cases where the lens is heated by the laser beam, the center of the lens is coincident with the center of the beam (ii) It can be turned on or off, such as by controlling the temperature in various parts of the thermal lens.

(iii) It can have a variable focal distance.

(iv) Aberrations can be corrected by small adjustments to the local temperature, or by selecting a heat sink with a spatially variable heat removal capability.

(v) Because of the flat nature of the basic structure, high yield and quantity manufacturing is possible.

One method of implementing such a thermal lens in systems described in the present application, could be by use of a mirror structure containing a partially light-absorbing layer, in which absorption of light generates the thermal lens effect. For start-up of the system, as will be described hereinbelow, the mirror could also contain an electric heater which enables scanning through a range of dioptric powers until lasing starts. Once lasing is established, it can, via absorption of the light, maintain the thermal lens itself. Although in this application, the thermal lensing effect is generated by changes in the optical power of the thin "lens" layer on top of the mirror assembly, and not strictly by a lens, the generic term "thermal lensing" is used throughout this application to describe the effect, even when it arises from thermal changes in a reflective element.

Thus, by careful design, it is possible to achieve a thermal lens effect that maintains the correct focal length, without the need for any electronic or other external control. Examples and methods of such designs are now explained below.

In a thermal lens application with such an automatic focusing capability, the natural expansion of the beam beyond the beam waist is used as the main control input mechanism for controlling the focal distance.

It is in the nature of optical systems that beams expand when moving away from their waist. The distance over which the beam's diameter is increased by a factor of 2 is called the Rayleigh length. The amount of expansion is determined by system design. Especially important parameters to determine the Rayleigh length include:

(i) The diameter of the beam at its waist.

(ii) The distance traveled from the waist.

(iii) The mode distribution of the beam—$TEM_{00}$ beams, for instance, expand less than multimode beams.

(iv) The presence of optical components in the beam's path.

(v) The beam wavelength.

An optical component with a thermal lensing capability, generally produced by absorption of some of the light incident thereon, can be designed such that over a predefined range, and for a certain optical power, a focal distance is maintained which is correct both for allowing lasing to occur, and for ensuring centering of the laser beam. The absorption is generally of a fixed fraction of the incident radiation, but dynamic absorption tuning may also be achieved by wavelength or temperature control. In such dynamic absorption tuning, if, for example, the absorption is too high, it would be possible to reduce it by either detuning the lasing wavelength from the thermal lens absorption maximum, or by lowering the intra-cavity power, or by cooling the thermal lens more aggressively.

Two processes drive the focal length and position of such a component towards the correct focal length required by the system, such that the stabilizing effect of the thermal lens is achieved. Two basic relationships exist between the focal length of the thermal lens, and the length of the lasing cavity, arising from the fact that the focal length of the thermal element is dependent on the power density of the power incident thereupon, and on its area distribution.

(i) When the receiver is moved away from the beam's waist on the gain medium, resulting in the cavity length increasing, the spot size generated on the thermal mirror increases. As a result, the focal length of the thermal lens created by that beam increases as well.

(ii) On the other hand, should the focal length become too short to maintain the optimal focal point, and to sustain just the $TEM_{00}$ mode, multimode lasing will commence, increasing the $M^2$ parameter of the beam, and thus increasing the beam's diameter on the thermal mirror. This increase in beam diameter may in turn increase the focal length of the thermal mirror, thus returning it towards the desired value.

Figures 8A, 8B, 8C:
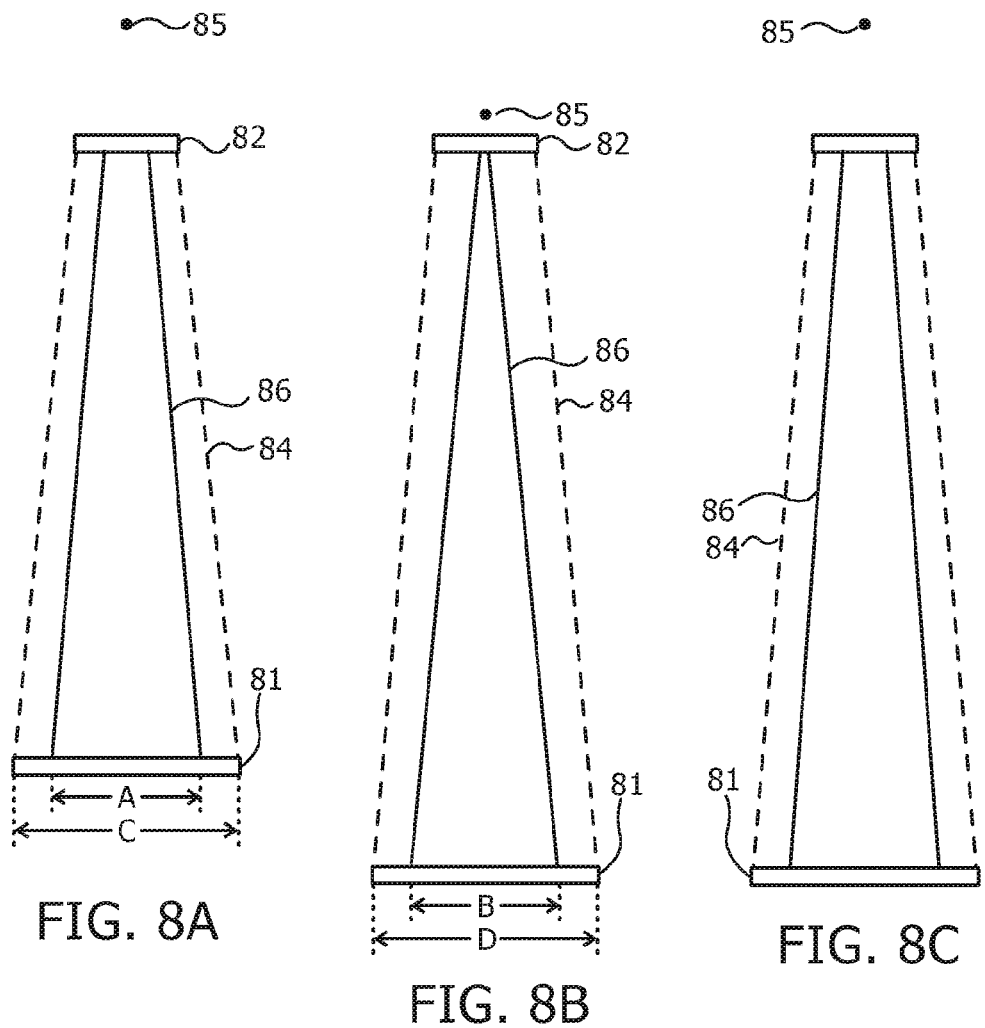
FIGS. 8A to 8C describe pictorially how a configuration of a thermal element can maintain the cavity lasing correctly aligned and within the desired stability limit, even while the cavity length and orientation changes with motion of the receiver relative to the transmitter.

Reference is now made to FIGS. 8A to 8C to describe pictorially how the trade-off between these two processes enables such a configuration of a thermal element to maintain the cavity lasing correctly aligned and within the desired stability limit, even as the cavity length and orientation changes with motion of the receiver. FIGS. 8A to 8C illustrate schematically the laser cavity with the receiver incorporating the thermal lensing element 81 mounted on the back mirror (or output coupler) of the cavity, and the gain medium 82 mounted within the transmitter unit.

In FIG. 8A, there is shown the situation where the receiver, incorporating the thermal element 81 is at an initial fairly close distance relative to the gain element 82 in the transmitter, such that the effective cavity length is relatively short. Because of the closeness to the beam waist, the spot size on the thermal lens is comparatively small, and the thermal lens thus generates a short focal length, commensurate with the short cavity length. The focal point 85 of the fundamental $TEM_{00}$ beam mode 86 (for a circular beam), is projected somewhat beyond the end of the cavity, in keeping with the planned requirement to ensure that the cavity operates in a stable zone. However, if the focal length begins to become shorter, it may not be able to support only fundamental mode lasing, and additional higher order modes will evolve. This is shown in FIG. 8A, where the small spot size on the gain medium 82 leaves a significant area of the gain medium unutilized for maintaining the fundamental $TEM_{00}$ mode, and higher order modes, such as $TEM_{01}$ may develop within the cavity to fill the gain medium, as shown by the dotted lines 84 in FIG. 8A. However, as such multimode propagation fills the area of the thermal element 81, marked C in FIG. 8A, the power of the thermal element falls because of the more uniform heating of the element, and the focal length of the thermal lens thus increases towards the optimum value for that cavity length. Conversely, if the focal point becomes too far away for the cavity length used at that moment, the number of higher order modes would be reduced, the beam diameter on the thermal component would be reduced to the value A in FIG. 8A, and as a result of the more localized heating, the focusing power of the thermal lense would thus increase again, shortening the focal length. This trade-off thus ensures stable operation, with the focal length iteratively kept at its optimum designed value. Reference is now made to FIG. 8B, which illustrates the situation when the receiver is moved further away from the transmitter. For the first moments after the movement, before any thermal changes have taken place in the system, the focal length of the thermal lens remains the same, and the focal spot 85 thus moves closer towards the gain medium 82 in unison with the movement of the receiver away from the gain medium of the receiver. The size of the lasing spot on the gain medium thus becomes smaller, as shown in FIG. 8B, such that the size of the lasing area of the fundamental mode on the thermal lens becomes larger. This is marked B in FIG. 8B, where B is greater than A of FIG. 8A. This larger incident area results in a more spread out heating effect on the thermal lens, which thus becomes optically weaker and its focal length longer, thus driving the focal spot further back beyond the gain medium 82. This movement of the focal spot, towards its original position in FIG. 8A, is shown in FIG. 8C, and it ensures a continued stable resonator operation in spite of the receiver having been moved further away from its original position. FIG. 8C shows the situation in the system after thermal equilibrium has again been achieved, with the beam configuration such that the cavity operates as a stable resonator, similar to that of FIG. 8A. The exact mix of fundamental and higher order modes may be somewhat different from that of FIG. 8A because of the different cavity length, but stable operation of the cavity will be maintained. The thermal lens thus generates a self regulating focusing effect, maintaining stable resonator operation independently of the position of the receiver relative to the transmitter. Of course, once the maximum distance has been superseded, lasing will cease.

The thermal lens focal length, for a thin thermal component approximation, is given by:

$$f = 1.1781 \frac{\kappa R_1^4}{\frac{dn}{dT} P_1 \alpha d^2}$$

where $\kappa$ is the thermal conductivity of the component;
$dn/dT$ is the derivative of the refractive index with respect to temperature;
$P_1$ is the intra-cavity power and $\alpha$ is the fraction of it absorbed by the thermal mirror;
d is the active mirror thickness; and
$R_1$ is the beam radius on the component.

With the exception of R, all the parameters in the above formula are predetermined by the design and the materials of the element, thus allowing for a design having a predetermined focal length f for a certain value of R and absorbed power $\alpha P_1$, and which will support the fundamental mode using that focal distance. When such a thermal element is moved closer to the transmitter, the mechanism described above will make sure that the correct focal length is maintained.

$R_1$, the beam's radius at the thermal mirror/lens, is determined by two factors (besides wavelength and orientation):
(i) The mode size of the fundamental mode on the gain medium on the active mirror in the transmitter, this being always smaller than the size of the active mirror itself. The mode size itself is determined by the focal length of the thermal mirror and the distance at which the beam is measured from the focal point.
(ii) The modes that can exist in the laser cavity.

If the thermal element is designed such that it absorbs a certain portion of the intra-cavity power then for any chosen material with given thermal lensing properties, absorption parameters and intra-cavity power, there is some maximal distance, where the mode size, determined by the lens, would support only fundamental mode lasing, due to limitations of the active mirror diameter. Without changing any of the above parameters, stable cavity lasing is not possible if the cavity length is increased beyond this distance while using the same parameters—intra-cavity power, absorption and thermal lensing properties. If this distance is increased beyond the point of single mode lasing, the focal point would move further away, and lasing would stop. However, if this distance is decreased, the size of the beam on the thermal element becomes smaller, as a result of which, the focusing power of the element would become stronger, compensating for the smaller focal distance now needed because of the shorter cavity length, as explained above.

Typically, the focal length would become too short to support only fundamental mode lasing ($TEM_{00}$ in the case of a circular beam), and additional higher order modes will evolve. These new modes would make the beam slightly larger, thus resulting in an increase of the focal length of the thermal element, thus bringing the focal distance to an optimal value. There are thus two balancing forces in operation on the cavity as a result of the thermal element:
(i) If the focal point becomes too close for the cavity length used at that moment, multimode lasing evolves, increasing the size of the beam on the thermal element and increasing the focal distance to the optimum value for that cavity length.
(ii) If the focal point is too far away for the cavity length used at that moment, the number of modes would be reduced, the beam diameter on the thermal component would be reduced and the focusing power would thus increase again, shortening the focal length.

Figure 9:
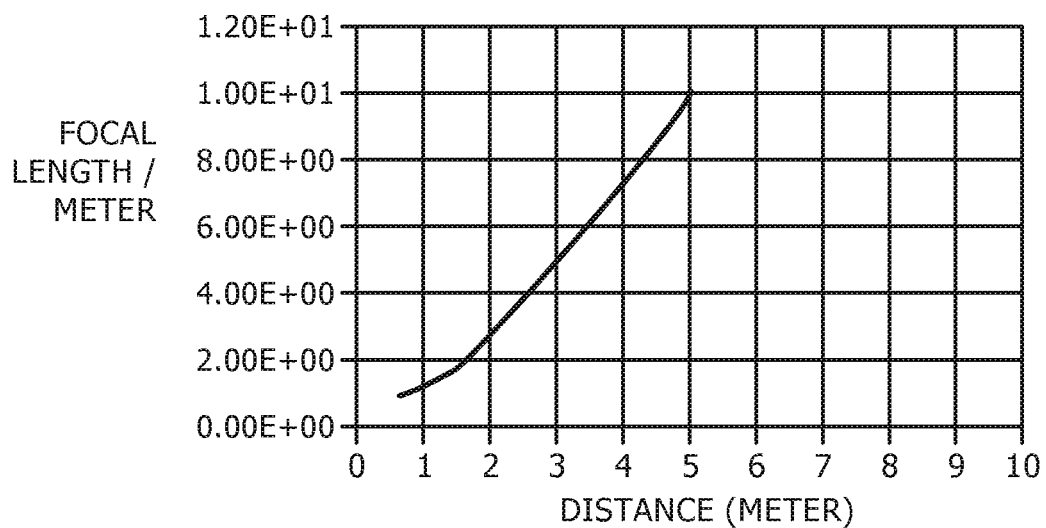
FIG. 9 is a graph of a result of a calculation showing the focal distance of the thermal element as a function of the transmitter-receiver distance.

FIG. 9 is a graph of a result of a calculation showing the focal distance of the thermal element as a function of the transmitter-receiver distance, for a pure $TEM_{00}$ system with intra-cavity power of 80 W, in which the thermal mirror is made of a thin, 300 micron, layer of silver thiogallate (AgGaS$_2$), AGS, and which absorbs 1.5% of the power traversing it, due to an absorbing coating on it, and the gain medium radius on the active mirror is 0.65 mm.

The design of such a system is based on determining optimal values for at least some of the following parameters:
(i) The diameter of the active part of the gain medium.
(ii) The parameters of the material used to achieve thermal lensing, especially its values of $dn/dT$ and $\kappa$. Other parameters, such as lifetime and cost could also be taken into account, but these parameters are of commercial and convenience importance, and do not affect the optical performance.
(iii) The thickness of the thermal lensing material d.
(iv) The amount of absorption on the thermal mirror.
(v) The mechanism for heat removal from the thermal mirror. Setting those parameters would determine the maximal operation distance for a given intra-cavity power.

For any choice of parameters it is possible to calculate the intra-cavity power using the above formula as well as Rayleigh's formula. However if a material with high $dn/dT/K$ is chosen, the choice of intra-cavity power is more flexible.

By using such a mirror/lens, the thermal component typically being a lens bonded to a heat sink or a mirror, it is possible to maintain the cavity in stable operation even when the receiver is moving, without having to mechanically or electronically align the lens to the correct position, focal length and direction.

Even if the beam is at an angle to the optical element, if the thermo-optical element is thin compared to its diameter, as described herein, the focusing power of the lens would behave as if it were a lens that is centered and perpendicular to the beam. For this reason a thin thermal element is preferable.

A number of limitations exist:

(i) The diameter of the active part of the gain medium needs to be large enough so that the Rayleigh length of the fundamental mode is long enough to enable the size of the beam on the thermal mirror to generate a sufficiently short focal length.

(ii) The diameter of the active part of the gain medium needs to be large enough so that the size of the beam on the thermal mirror is not bigger than the thermal mirror itself, even at maximal operating distance.

(iii) The diameter of the active part of the gain medium needs to be small enough to allow for a sufficiently low saturation power of the gain medium so as to provide sufficient lasing efficiency.

Making the diameter of the active part of the gain medium too small would cause the beam's area on the thermal mirror to be large, which will require high power for heating the element in order to maintain the proper focal length. Typically the Rayleigh length needs to be in the same order of magnitude as the maximal operation distance. If an operation distance of several meters is chosen, the diameter of the active part of the gain medium would have to be around 1 mm. However setting this diameter to give too large an area, would require higher power to create population inversion, as this is determined by the intensity of the pump, rather than its power, and would make the laser inefficient since the creation of population inversion in a larger area would need higher pump power. The power used to cause population inversion is almost entirely converted to fluorescent light and heat, rather than to laser radiation.

For an operation distance of 3-5 meter, which is typical of the required range of the type of transmission system described in WO/2007/036937, the optimal value would appear to be in the range 0.2-2 mm radius.

From the above two values, combined with the maximal angle allowed for the thermal mirror and the beam, the minimal radius of the thermal mirror can be calculated.

In the above described systems, the thermal lens is maintained at the optimal focal length by the optical power that exists in the cavity during lensing. However in order for such a system to be practical, there is further need to achieve two objectives.

(i) The thermal lens needs to be created initially for lasing to commence.

(ii) When the intra-cavity power changes, which can easily occur as a result of additional losses in the cavity, the thermal lens has to be maintained, either by changing the intra-cavity power or by heating the thermal lens using an external heat source.

To achieve this, two capabilities are needed in the system.

(i) The ability to heat the thermal lens using an energy source other than intra-cavity lasing. There are many methods to achieve this—especially important though are electrical and optical heating as they can be easily be controlled electronically.

(ii) The ability to detect changes in the intra-cavity power and to compensate for them. Such an ability also has another important use—to detect factors compromising the safety of operation of the system, which are usually accompanied by power loss and/or changes of the beam shape.

Creating the thermal lens may be achieved by one or more of:

(i) Disposing one or more heating elements in the vicinity of the thermal mirror. Electric heating elements are particularly suitable for this method.

(ii) Illuminating the thermal mirror with light to create the initial thermal lens.

(iii) Applying a force to the thermal mirror, so as to bend it and create the initial focal distance. This could be readily achieved using a piezo-electric actuator.

(iv) Disposing a controlled optical element in close vicinity to the thermal mirror. Such an element may be a liquid crystal element or a similar element that changes it refractive index with response to electrical current or voltage.

In some systems it may be advantageous to use two or more such thermal focusing elements instead of a single one.

The thermal lens creation process needs to be stopped gradually when lasing starts, to avoid creating a lens stronger then needed for stabilizing the lasing. This can be done by detecting lasing, or more precisely by detecting intra-cavity power. In many cases this reduction in the heating of the thermal lens needs to be gradual rather than sudden, since lasing typically does not start at full power. Such changes in the intra-cavity power may be detected by monitoring either the output power or the intra-cavity power itself, or a small portion of the intra-cavity power or of the output power.

During this startup procedure the system has also to perform several other tasks:

(i) To verify that the correct and qualified receiver receives the power. This could be used to allow for multiple receivers to receive power from the same transmitter at different times.

(ii) To verify that there are no power leaks or transparent objects in the cavity's path (iii) To determine operational parameters, such as corrections to the thermal lens, the demanded intra-cavity power, wavelength and other receiver-transmitter interface parameters.

Avoiding transparent objects in the cavity may be done by directly measuring the effect of the object, for example, by transmitting a light beam through it. By placing a light source having a specific spectrum in the receiver or transmitter, it is possible to measure the transmission of the cavity in various directions and at different wavelengths, either by a round trip method using the receiver/transmitter as retroreflectors, or by a one way method. In such a case, if use is made of a wavelength that is absorbed by glass, such as UV wavelengths, it should be possible to detect a window in the cavity's path.

Such a startup procedure can also be used to enable the system to deliver power to any specific receiver out of a number of receivers that may be positioned around the transmitter. The various receivers are interrogated to determine their identity, and all other receivers are turned off except the one with the correct identification.

Figure 10:
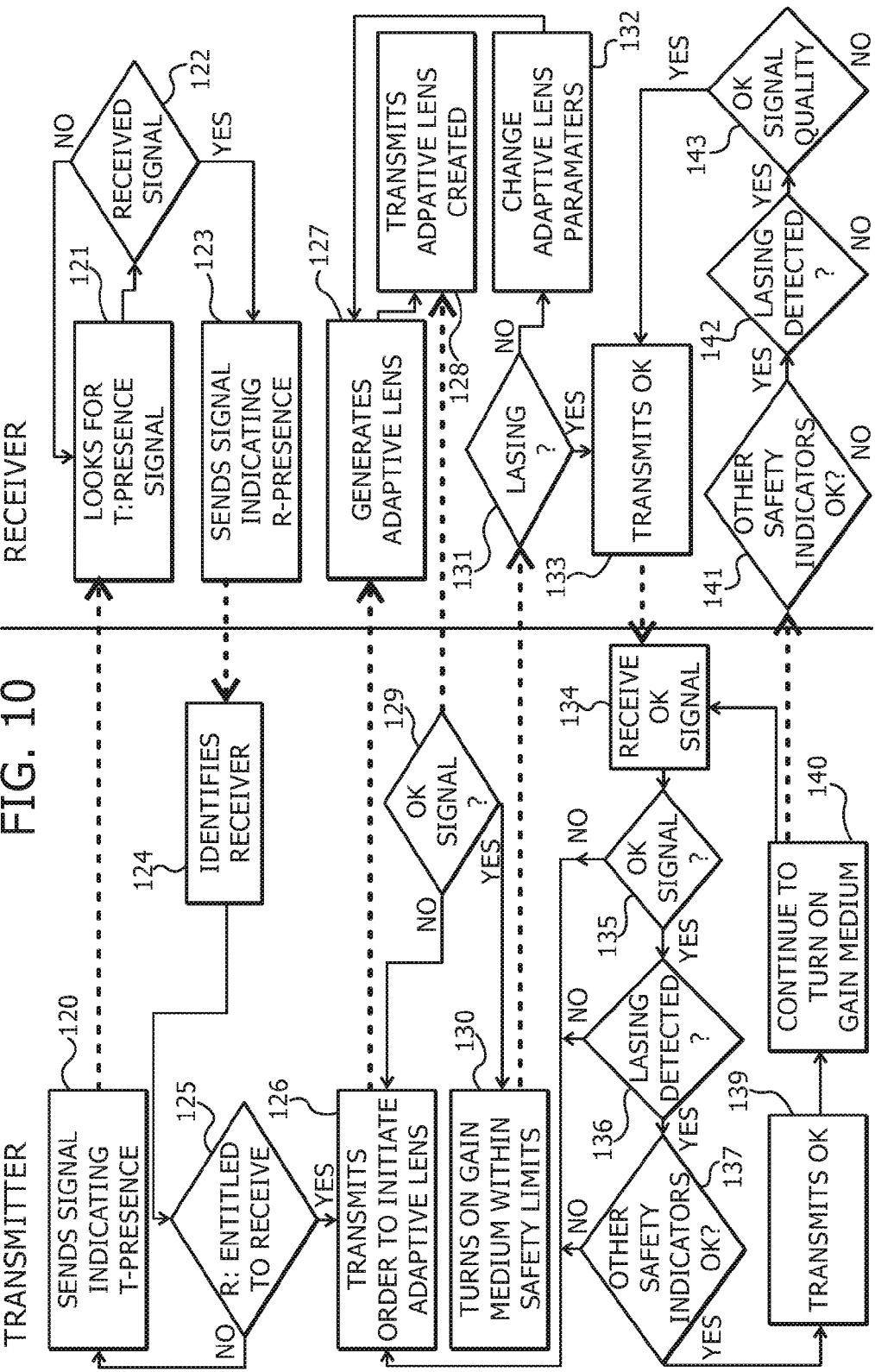
FIG. 10 is an exemplary flow chart showing typical operation of the system from the start-up procedure.

Typical operation of the system from the start-up procedure may be illustrated in the exemplary flow chart of FIG. 10, though it is to be understood that other possible schemes may equally well be used. In this chart, the type of channel used to convey the information is shown by the form of the lines connecting the various steps. Electronic control signals transmitted most conveniently over hard wiring are shown as continuous lines. Control signals advantageously transmitted by RF or wireless are shown as faint dotted lines. Information determined by the content of the lasing beam is shown transferred by heavy dotted lines. It is to be understood, though, that other control in formation transfer schemes are also possible.

In steps 120 to 125, the transmitter and designated receiver confirm that they are capable of operating together as a pair, communicating with each to ascertain that the designated receiver is entitled to receive power.

In step 120, the transmitter sends a signal over its sphere of influence, over which it can transmit, to indicate that it is ready to transmit laser power.

In step 121, the receiver sensors are busy scanning the environment in order to detect whether a transmitter is available for providing it with power.

In step 122, if no transmitter signal is received, the control returns to step 121 to instruct the receiver to continue looking for a transmitter. On the other hand if a transmitter signal is detected, then in step 123 the receiver sends back a wireless signal to the transmitter, indicating that it is present and ready to receive power.

In step 124 the transmitter control system identifies the receiver and in step 125 determines whether it is entitled to receive power, such as by ascertaining that it can communicate correctly with the transmitter. If no such confirmation is ascertained, then the transmitter continues to send out signals in step 120 until it does detect a candidate receiver. On the other hand, if receiver identification is positive, then control proceeds to step 126.

The above steps have been solely used in order to establish a valid transmitter and receiver pair. From this point on, from step 126, the procedure for establishing lasing power is now begun.

In step 126, the transmitter instructs the receiver to commence creating the adaptive optical focusing element, using a procedure such as is described hereinabove.

In step 127, the receiver commences this start-up procedure and a rudimentary adaptive lens is generated, followed in step 128 by transmission of a signal back to the transmitter that such a lens has been created.

In step 129, the transmitter checks for such a signal, and if none is detected, control returns to step 126 where an instruction to initiate adaptive lens generation is again transmitted.

On the other hand, if confirmation of the generation of an adaptive lens is received in step 129, then in step 130, the transmitter instructs the excitation pump to try to turn on the gain medium for a very brief time by emitting a single pulse of exciting power, sufficiently short so as not to exceed the maximal safety limits should lasing occur towards an "unauthorized receiver".

In step 131, the receiver attempts to detect whether a lasing beam is received. If no lasing is detected, them in step 132, the receiver attempts to change the adaptive lens parameters in order, in step 127, to more successfully generate a lens capable of providing the cavity with the correct parameters to support lasing. Typically a number of focal lengths, center positions of the lens and other parameters need to be checked before lasing can start.

The iterative control loop through steps 128, 129, 126 is then repeated, until a successful adaptive lens is created. Success of this stage, as determined by the detection in step 131 of lasing of significant power, is converted into an enabling signal in step 133, and is transmitted by the receiver back to the transmitter.

In step 134, the transmitter decodes the enabling signal received from the transmitter. In step 135, the transmitter control checks that the enabling signal transmitted by the receiver in step 133 exists and indicates normal safe operation. In steps 136 and 137 further checks are performed to ascertain positive laser detection and the absence of any safety-related disabling signals. Amongst the checks performed could be the continuously monitoring for signals warning about any of power fluctuations; loss of control signal; transmitted status from the receiver; and a stop signal from the receiver as well as the signal from the "window detector" an other safety mechanisms. Negative results from any of these interrogation steps, returns control to step 126, possibly with a delay, when the instruction to generate a new adaptive lens is transmitted.

If, on the other hand, the laser detection and safety checks in steps 135, 136 and 137 are passed, lasing having been achieved, and the measured intensity indicating that no losses that exceed safety limits are present, and there is no other indication of a potential problem, then the signal is given in step 139 for the transmitter to continue to turn on the gain medium using continuous pump power. This is performed in step 140, which passes a signal to the transmitter enabler 134, and the system continues to lase.

In steps 141 and 142, the receiver now checks that lasing is properly detected, and that no safety warning indicators are flagged. Typically, a few pulses are needed to determine that the party is not blocked by any transparent objects. In step 143, a confirmation signal is generated that lasing of correct quality is established. This signal is transmitted by the receiver at step 133, back to the transmitter.

Thus, while lasing is preceding and power is being transmitted, both the receiver and transmitter control circuits continually test for the presence of lasing and for the absence of any safety warnings.

An alternative method to that of steps 136-137 above, to determine that no transparent objects, such as windows, are located in the optical path between the transmitter and receiver, is for the transmitter to emit light having a predetermined spectrum, but which would change if it were to pass through a transparent object. For example, if the spectrum were to include UV wavelengths, these would be absorbed by a glass window. The light would be reflected from the retroreflector in the receiver so that it may be measured by the transmitter after passing twice through the cavity. The same method can be performed by transmitting light from the receiver or transmitter and measuring it at the transmitter or receiver respectively. However the probably simplest, most energy-efficient method, is to do so from the transmitter.

Figure 11:
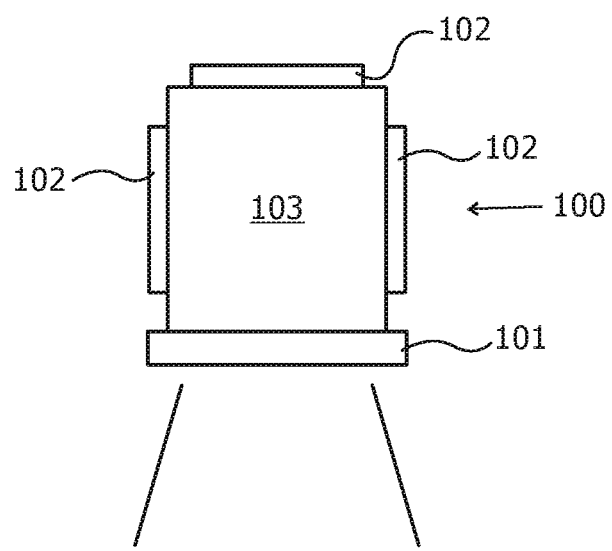
FIG. 11 illustrates schematically an exemplary diffuser construction which may be conveniently used with the systems described in this disclosure.

Such a signal can be generated using a UV or white light LED source, for example, or any other suitable light emitting device. In the case of a UV LED, a window would absorb the UV so that it does not reach the transmitter, allowing the transmitter to detect such a window. In the case of a white light source, the transmitter can detect a change in the spectrum of the light source, such as by the use of a number of detectors, each having a filter with a different passband, such that differences in the detector outputs indicate absorption in a specific wavelength region. A component arrangement which may be used to perform these tasks are shown in FIG. 11 below. To distinguish this special light source from the environment it is possible to modulate the light source in some predetermined manner.

The same special techniques described above, or at least some of the steps therefrom, can also be used to verify that no risk occurs during normal operation. If the signal from the UV LED, or from the white light source, or any other light source having a unique spectrum, is stopped or its level changes abruptly, or if the power level in the cavity changes, or if the receiver stops transmitting the "OK" signal, the transmitter should stop lasing as soon as possible to avoid a potentially unsafe situation. In such a case, the transmitter could typically wait a few seconds, and then reinitialize the startup procedure.

As previously mentioned, there are a number of techniques to avoid exceeding the maximal allowed optical power density on the components. For most components the obvious method of controlling the beam's radius is the best method. However, photovoltaic cells are not currently available with a capability of handling the typical power densities present in a system capable of powering, for instance, a laptop computer, amounting to many watts of optical power on a few $mm^2$ area.

In order to spread out the beam, to allow the photovoltaic cell to receive such levels of power, a diffuser may be used.

Reference is now made to FIG. 11, which illustrates schematically one exemplary diffuser construction 100, which may be conveniently used with the systems described in this disclosure. The diffuser resembles an integrating sphere in action, in that the rear leaking optical power extracted from the back of the output coupler 101 is bounced around the inside of the diffuser onto one or more photovoltaic cells 102 disposed around the walls. The diffuser filling material may be made of a translucent material, such that the incident light is scattered in all directions. The walls may be constructed rectilinearly for more convenient integration into the receiver geometry.

Figure 12:
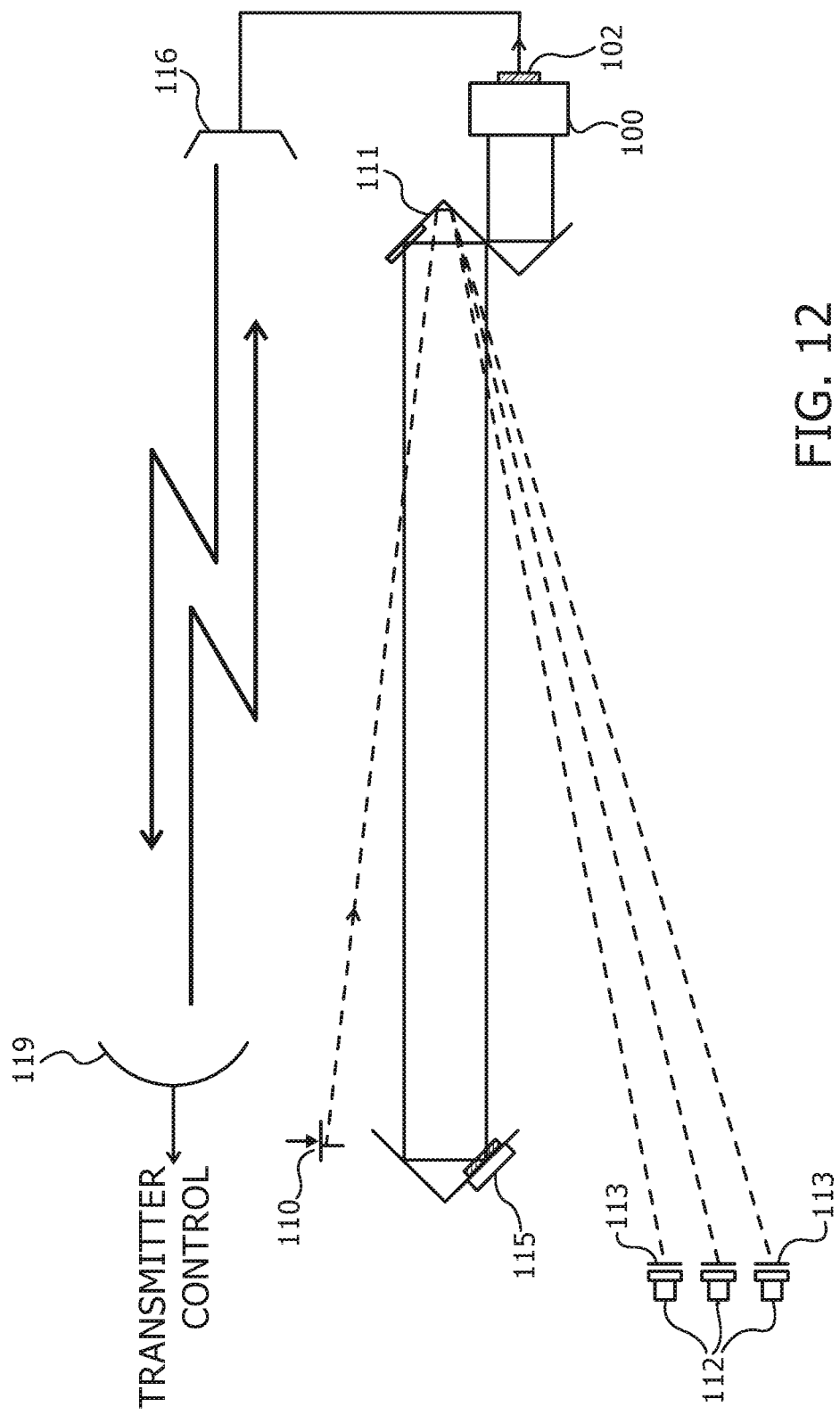
FIG. 12 is a system similar to that shown in FIGS. 2 and 3, but including details of the probe beam method of determining the presence of a reflective obstruction in the beam path.

Reference is now made to FIG. 12, which is similar to the system shown in FIGS. 2 and 3, but includes details of the optical component values, and the control modules and control paths for ensuring correct operation of the system. The system consists of a transmitter and receiver. The transmitter may consist of an active mirror as gain medium, with active gain area having a radius allowing for a Rayleigh length of 1-30 m (typical usage range) or a diameter of approximately 0.1-4 mm of the active part of the gain medium, as well as two mirrors connected to it at normal angle to the active mirror and to each other.

Further the transmitter should include an exciter 115, capable of exciting the gain medium. An exemplary exciter can be a laser source or any other optical pumping source, as is known in the art, or a current source. The exciter should be of the type which directs the pump light from the side of the gain medium, as is known in the art, rather than a pump which directs the pump energy onto the front face, which arrangement may obstruct part of the laser transmitting aperture. An important additional set of components is related to the detection of the control light source, used in order to determine whether an obstruction enters the beam path, as explained hereinabove. The light source 110, could be a UV LED, and the light beam, after reflection in the receiver retroreflector 111, is detected by one or more detectors 112, possibly with filters 113 at their inputs if a broadband source is used, all as explained hereinabove. In some cases the transmitter could also have a data transceiver 119 to transmit and receive the receiver's status.

The receiver may consist of a retroreflector, in which at least one mirror should be a thermal mirror and at least one mirror should be an output coupler. It should also have a light-power converter, and may have a control light source, and some logic circuits. Possibly it could also have a transceiver 116 to transmit and receive its status and instructions to the transmitter.

Cavity Design Calculations

Although the practical details and some theoretical considerations for implementing systems described in the present application have been described hereinabove, some additional theoretical background material for designing the cavity and the thermal lens parameters are now presented.

As previously explained in some detail, in order to ensure safe operation of the systems of the present application, and to limit the resonator losses, the laser resonator has to be a stable one, in which the basic mode of the beam has a closed path inside the resonator. For unstable resonators, the beam spillover may be potentially hazardous, and the diffraction losses may be so high that a substantially higher laser gain would be needed.

It appears to be convenient to operate the device relatively close to the stability limit, where the dioptric power of the thermal lens in the receiver is slightly smaller than 2 divided by the resonator length. In that regime, a reasonably small laser mode on the gain medium can be achieved without using additional optics, which would strongly restrict the allowed angular range. The beam then exhibits substantial expansion on its way from the transmitter to the receiver.

A simplified model of the resonator, as shown in FIG. 2, is that of a linear resonator, disregarding the two corner cubes. On the transmitter side, there is the active mirror with its gain medium, which may have some moderate dioptric power due to thermal lensing in the gain medium, and on the receiver side there is the variable focus mirror with its thermal lens effect.

Figure 13:
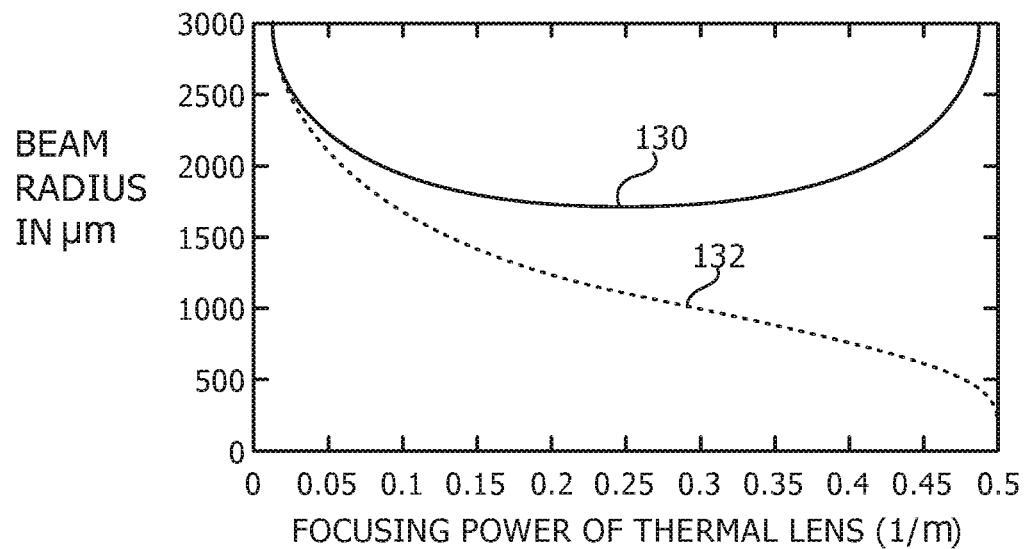
FIG. 13 is a graph illustrating the change in the radius of the laser beam spot as a function of the thermal lens focusing power.

Reference is now made to FIG. 13, which is a graph illustrating the effect of the thermal lens in the receiver. A fixed resonator length, (the distance between the transmitter and the receiver) of 4 m is assumed. All resonator modes calculations are done based on the well-known ABCD matrix algorithm.

In the graph of FIG. 13, the ordinate is the beam radius in microns, while the abscissa is the focusing power of the thermal lens in diopters (1/m). Both curves assume that there is no thermal lensing at the transmitter. The top curve 130 shows the radius of the beam on the thermal lens in the receiver as a function of its focusing power, while the bottom curve 132 shows a radius of the beam on the gain medium as a function of the thermal lens focusing power. As expected, the beam spot size on thermal lens in the receiver is always larger than that on the gain medium in the transmitter. As is observed the shorter the focal length of the thermal lens the smaller the spot size on the gain media, and conversely for the spot size on the thermal lens. A focal length of shorter than about 2 m would render the cavity unusable. As an example of the use of these design curves, it is observed that a beam radius of, for instance, 0.6 mm (600 µm) at the gain medium in the transmitter requires operating the resonator with a thermal lens of focal length 2.13 m (a focusing power of 0.47/m), and for this focal length, the beam radius at the receiver is then 2.4 mm, as seen from the top curve of the beam diameter on the thermal mirror.

For lower dioptric powers (longer focal lengths), the beam radius on the gain medium in the active mirror becomes too large, so that the effective gain is reduced and lasing will eventually not be possible. For higher dioptric powers (shorter focal lengths), but still within the stability region, the fundamental Gaussian resonator mode becomes smaller than the pumped spot on the active mirror, and higher-order modes will also start to propagate. Finally, laser oscillation will not occur for even stronger thermal lensing beyond the stability region at the right hand side of the graph, as the round-trip power losses would become very high.

Figure 14:
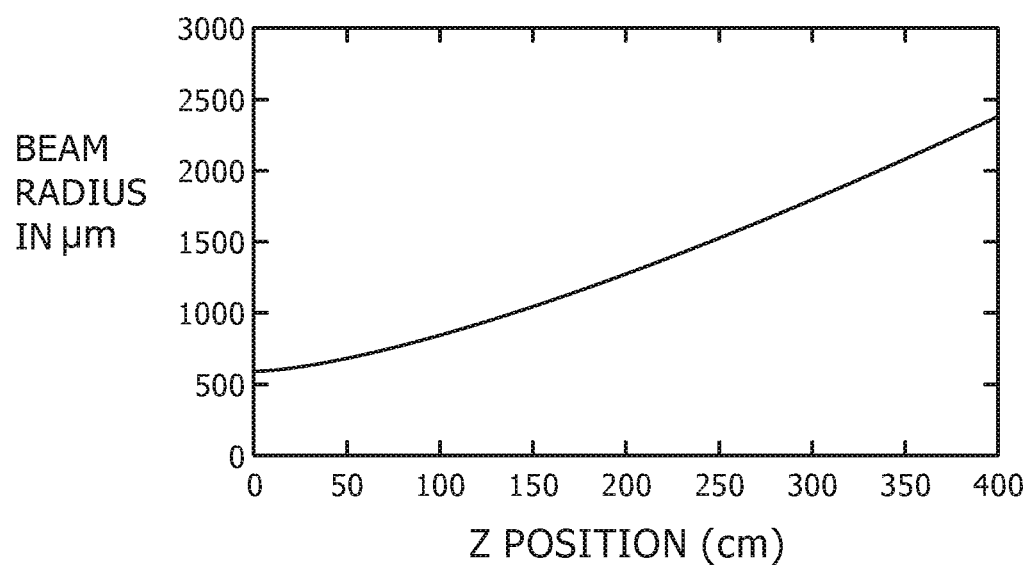
FIG. 14 is a graph showing how the beam expansion develops along the length of the resonator.

Reference is now made to FIG. 14 which shows how the beam expansion develops along the length of the resonator, up to the full 4 m length of the resonator used in the graphs of FIG. 13.

Figure 15:
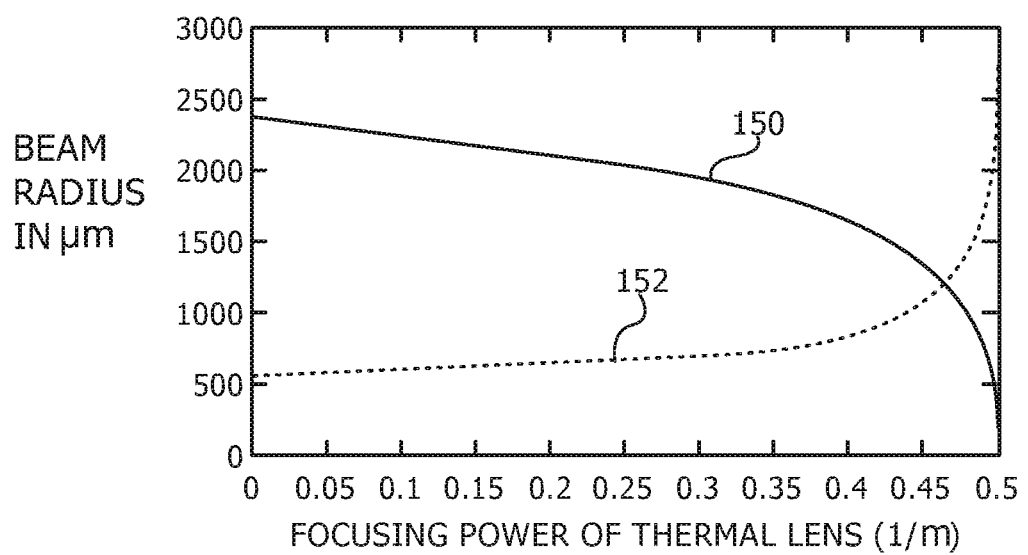
FIG. 15 shows the influence of thermal lensing on the gain medium in the transmitter for the resonator described in FIG. 13.

References now made to FIG. 15 which shows the influence of thermal lensing on the gain medium in the transmitter for the above described resonator shown in FIG. 13. Although attempts should be made to limit the strength of thermal lensing in the gain medium, some thermal lensing may occur here and its effect is shown in FIG. 15. The axes of the graph in FIG. 15 have the same meanings as those of FIG. 13. The top curve 150 shows the radius of the beam on the mirror in the receiver as a function of the thermal lens effect focusing power, while the bottom curve 152 shows the radius of the beam on the gain medium as a function of its thermal lensing focusing power.

Thermal lensing increases the mode size on the gain medium in the transmitter, which however can be compensated by using somewhat stronger lensing in the receiver, as long as the thermal lensing in the gain medium is not too close to the corresponding stability limit.

The position of the stability limits with respect to dioptric power in the transmitter T and receiver R strongly depends on the distance d between T and R: the limits for the dioptric powers are at 2/d (for example, 0.5/m for the example shown of d=4 m). From this result, the following can be determined:
(i) The dioptric power at R has to be varied roughly in inverse proportion to d. The dependence is actually slightly weaker, as for larger distances it is necessary to go closer to the stability limit.
(ii) Thermal lensing in T can limit the allowable range d. If a range of, for instance, 5 m is desired, the dioptric power of the active mirror had to be limited to ≈0.3/m.

As a rough estimate for the dioptric power to be expected in an active mirror with a Gaussian pump intensity distribution, the following formula can be used (the inverse of the equation shown in the detailed description):

$$F_{th} = \frac{\partial n}{\partial T} \frac{8 d^2 P_{dis}}{3\pi \kappa w^4}$$

where the total dissipated power is $P_{dis}$, the Gaussian pump beam radius is w, and the thickness d of the absorbing medium, which is assumed to be mounted on a heat sink with constant temperature. For example, using the values $P_{dis}$=4.5 W, w=0.6 mm, d=150 µm, κ≈8 W/Km, the result is $F_{th}$=0.25/m, which is close to the mentioned limit. A smoother pump intensity distribution (e.g. with some super-Gaussian shape) may be used to reduce lensing; on the other hand, there are additional contributions introduced via mechanical stress, which are more difficult to estimate, and the limited thermal conductivity of the heat sink, which tend to increase the value. Some engineering trade-off may thus be required to achieve a sufficiently weak thermal lens in the transmitter. A possible measure would be to have a water-cooled heat sink where the center of the disk is cooled most aggressively, such as by making the thickness of the metal separating disk and cooling water a minimum at this point. Since thermal lensing at T is mostly dependent on the pump profile, it is also possible to add a fixed optical element to correct for this. In particular, one of the other mirrors of the retroreflector might have a slight convex (and thus defocusing) curvature.

These considerations further show the need to use an active mirror rather than a conventional side-pumped or end-pumped laser geometry, which would lead to stronger thermal lensing.

As has been shown above, the dioptric power of the thermal lens must be kept somewhat below 2/d. This means that it will vary considerably, if it is desired to operate with distances between T and R which may vary, for instance, between 1 m and 4 m. For large distances (large d), the beam radius at the receiver R becomes larger. The minimum beam radius at R is set by the maximum possible mode radius at the transmitter T, which is essentially given by the radius of the pumped spot of the active mirror, and by the corresponding beam divergence over the given range. If the beam radius at T is $w_0$ and the beam is diffraction-limited, it is found that beam radius at R is given by:

$$w_R = w_0 \sqrt{1+(d/z_R)^2}$$

at the receiver, with the Rayleigh length given by:

$$z_R = \pi w_0^2/\lambda.$$

For example, with $w_0$=0.6 mm, d=4 m and λ=1064 nm, the receiver beam radius is given by $w_R$=2.3 mm. Large values of $w_R$ may be problematic because of the required size of the receiver and/or because of the power required to form the thermal lens. A larger value of $w_0$ would help in this regime to reduce $w_R$ (as it reduces the beam divergence), but leads to a higher threshold pump power.

Assuming that the thermal lens mirror is constructed using a thin absorbing layer, and heat flow is essentially in the direction normal to the surface, the dioptric power of the lens is given by:

$$F_{th} = \frac{\partial n}{\partial T} \frac{16 d_{abs}^2 P_{dis}}{3\pi \kappa w_R^4} \qquad (1)$$

where $d_{abs}$ is the thickness of the absorbing layer, ∂n/∂T is the temperature coefficient of the refractive index, and κ is the thermal conductivity; it is assumed that the absorbing layer is in perfect thermal contact with a perfectly heat-conducting substrate, having a uniform temperature. Although these approximations may not be exactly fulfilled in a real device, the formula shows the scaling properties. The key aspect is the strong dependence on $w_R$. If $w_R$ is doubled, for example, the dissipated power has to be increased by a factor of 16 to achieve a given dioptric power. However, a doubling of $w_R$ corresponds approximately to doubling the distance d and thus to a reduction of the required dioptric power by a factor of 2. Nevertheless approximately 8 times the dissipated power is needed for twice the distance d, if the beam is always diffraction-limited.

The latter detail shows a method of reducing the strong dependence on the range: for smaller distances, $w_R$ can be increased by reducing $w_0$ below the radius of the pumped spot. This not only increases the divergence of the fundamental beam, but also leads to the excitation of higher-order resonator modes, further increasing the effective beam radius at the thermal lens mirror. This condition can be achieved simply by moving somewhat closer to the stability edge, i.e., by slightly increasing the dioptric power of the thermal lens. This is thus a simple way of controlling $w_R$. In order to operate the thermal lens mirror with a constant dissipated power, it can be adjusted so that $w_R$ becomes slightly larger for larger distances d.

There is a built-in self-stabilizing effect. If the dioptric power rises for any reason, this reduces $w_0$, increases $w_R$, and thus strongly reduces $F_{th}$ according to eq. (1). The system should thus be able to self-stabilize a certain value of thermal lens dioptric power. Although significant fluctuations are expected, for instance, due to mode jumps in the optical power and beam radius, as introduced by different resonator modes starting or stopping oscillation, these should not profoundly disturb the system operation.

Eq. (1) also shows how it is possible to obtain a thermal lens mirror which has a sufficiently high dioptric power while absorbing only a moderate power: such lenders showed use a medium with high ∂n/∂T, low thermal conductivity, and sufficient thickness, as previously explained the detailed description section of this application. Some further improvement is possible by having a somewhat reduced thermal conductivity for the substrate, but still high enough to ensure an essentially one-dimensional heat flow.

The above description of the system utilizes a linear resonator. However, the use of corner cubes means that a non-planar ring resonator is actually obtained. Important issues can arise from the fact that the two focusing elements—the active mirror in the transmitter and the thermal lens in the receiver—are impinged by the incoming beams at a substantial angle of ≈54.7°. This has the following consequences:

(i) If the incoming beam has a circular cross section, the illuminated area on the mirror becomes elliptical. It is elongated in the plane of incidence by a factor of ≈1.73.

(ii) For a thermal lens this means that the gradients become weaker in the direction of the plane of incidence, compared with the other direction. While this effect alone would decrease the focusing effect in the plane of incidence, there is an opposite geometrical effect due to the projection of the beam onto the mirror surface. These effects can exactly cancel each other for suitable construction of the mirror creating the thermal lens. The simplest configuration is one with a thin absorbing layer, where the heat flows into the substrate essentially only in the direction normal to the surface. In that case, the local temperature increase is directly proportional to the local power intensity, with no influence of the intensities at other points. In this situation, the following argument can demonstrate that the thermal lens will not introduce an asymmetry. Assuming a beam with circular cross section incident on the mirror. The optical intensity of each point on the mirror will depend only on the distance from the axis of the incident beam. The same holds for the optical phase shift experienced at any point, as the temperature increase is assumed to be proportional to the local intensity. This means that despite the non-normal incidence, a phase shift for the reflected beam is obtained which only depends on the radial coordinate, and not on the azimuthal one. This is the same as for a circular lens with normal incidence; namely that there is no astigmatism.

(iii) Overall, the thermal lens becomes weaker due to non-normal incidence, essentially because a larger area is heated.

(iv) During the start-up procedure, as explained in the detailed description section above, the electrically generated thermal lens needs to have an elliptical shape.

A more realistic resonator would be a non-planar ring resonator containing all six reflectors, rather than the simple linear resonator as discussed above. This would not be expected to yield further information on resonator modes sizes, as the evolution of beam radius along the resonator depends only on the lengths of the arms (disregarding reflections at plane mirrors, which don't modify the evolution) and on the dioptric powers. It would allow, however, the study of the effects of rotating the receiver R, around the axis between the transmitter T and receiver R, including the exact beam path, possible polarization changes, etc. A comprehensive model is complex, but as an initial model, it can be assumed that R and T are aligned to within 2 to 5 degrees Simpler qualitative arguments can give some assurance that a closed beam is possible even under complicated geometric conditions. A simple geometrical configuration is assumed, where the pumped spot on the active mirror and the thermal lens have exactly the same radial and azimuthal position. Each corner cube then reflects the beam simply with an inverted radial position. If the receiver is now somewhat rotated, there is still a closed beam path, but it becomes non-planar—not only at the corner cubes, but also the two beams between T and R become non-parallel. This is possible because of the two focusing reflectors (active mirror and thermal lens)—such a configuration will not only refocus the beam, but also deflect it, if it is not hit exactly in the center of its profile. The thermal lens, however, will, in the steady state, be exactly centered and will thus perform such a reflection only in a transient regime. The spot hit on the lens should then move until a position is found where the beam is no longer deflected by the thermal lens. Concerning the geometric beam path, the receiver then works like an ordinary corner cube, even though it still does the essential focusing.

The total power efficiency of the device will depend on a number of factors:

1. The diode laser for pumping the active mirror will normally have an efficiency of roughly 50% or slightly less when including losses in the driver electronics.
2. A few percent of the pump light may be lost, for instance, at the crystal surface or due to incomplete absorption in the crystal.
3. The quantum defect leads to a loss of 31%.
4. A difficult factor to estimate is the quantum efficiency of the laser, since this depends on factors such as parasitic losses, diffraction losses (e.g. due to aberrations of the thermal lens), imperfect matching of mode sizes, etc. Overall, it is not expected that high efficiency is obtainable. As a rough estimate, 30% to 50% can be obtained.
5. The efficiency of a photovoltaic cell may be significantly higher than a cell designed, for instance, for sun light, with its very broad optical spectrum. As a rough estimate, 50% may be an acceptable level.
6. Overall, the power efficiency from the wall plug to the mobile device should be of the order of a few percent. This appears to be sufficient for many commercial applications, comparable to the differences between a 500-W desktop computer and a 10-W laptop computer. Use of a VCSEL as the active mirror, which can be more than 50% efficiency, and which could be directly driven, should substantially increase efficiency. Assuming 30% efficiency for the laser and 50% for the photo voltaic cell, approximately 10% overall efficiency can be obtained.
7. Lasing could be obtained using a 20-W pump, and capable of supplying 5 W output from the output coupler, which would translate after conversion to 2.5 W of electrical power. This is power level is five times the power needed to charge a cellphone and 25% of the power needed to operate an efficient laptop, such that the devices described should have significant usefulness.

It is appreciated by persons skilled in the art that the present invention is not limited by what has been particularly shown and described hereinabove. Rather the scope of the present invention includes both combinations and subcombinations of various features described hereinabove as well as variations and modifications thereto which would occur to a person of skill in the art upon reading the above description and which are not in the prior art.

What is claimed is:

1. A free-space lasing system for generating a laser beam, said system comprising:
   a power transmitting unit comprising a first retroreflector, and having an angular field of view;
   at least one power receiver unit comprising a second retroreflector, and remotely located relative to said power transmitting unit;
   a gain medium disposed between said first and second retroreflectors, in proximity to said first retroreflector of said power transmitting unit, such that said laser beam is generated between said first and second retroreflectors;
   an automatically adjustable adaptive optical element optically positioned between said second retroreflector and said gain medium
   an element for extracting energy from said laser beam,
   wherein said automatically adjustable adaptive optical element is configured to maintain stable resonator modes between said first and second retroreflectors, by compensating for change in resonator configuration arising from motion of said power receiver unit.

* * * * *